(12) United States Patent
Yoo et al.

(10) Patent No.: US 9,666,773 B2
(45) Date of Patent: May 30, 2017

(54) LIGHT SOURCE PACKAGE AND DISPLAY DEVICE INCLUDING THE SAME

(71) Applicant: SAMSUNG ELECTRONICS CO., LTD., Suwon-si, Gyeonggi-do (KR)

(72) Inventors: Chul-hee Yoo, Suwon-si (KR); Da-hye Kim, Hwaseong-si (KR); Young-sam Park, Seoul (KR); Man-ki Hong, Gwangmyeong-si (KR); Ho-young Song, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 163 days.

(21) Appl. No.: 14/620,026

(22) Filed: Feb. 11, 2015

(65) Prior Publication Data
US 2015/0228869 A1   Aug. 13, 2015

(30) Foreign Application Priority Data
Feb. 11, 2014   (KR) .................... 10-2014-0015649

(51) Int. Cl.
*H01L 33/54*   (2010.01)
*H01L 33/50*   (2010.01)
(Continued)

(52) U.S. Cl.
CPC ........ *H01L 33/54* (2013.01); *G02F 1/133609* (2013.01); *H01L 25/0753* (2013.01); *H01L 33/504* (2013.01); *H01L 33/507* (2013.01); *H01L 33/60* (2013.01); *G02B 6/0023* (2013.01); *G02B 6/0073* (2013.01); *H01L 2224/48091* (2013.01); *H01L 2224/73204* (2013.01);
(Continued)

(58) Field of Classification Search
CPC ... H01L 25/0753; H01L 33/54; H01L 33/504; H01L 33/507; H01L 33/60; G02F 1/133609
See application file for complete search history.

(56) References Cited

U.S. PATENT DOCUMENTS 5,598,059 A * 1/1997 Sun ...................... C09K 11/574
                                                        313/503
6,372,608 B1   4/2002 Shimoda et al.
(Continued)

FOREIGN PATENT DOCUMENTS

JP   2007-080864 A   3/2007
JP   2011-066229 A   3/2011
(Continued)

*Primary Examiner* — David V Bruce
(74) *Attorney, Agent, or Firm* — Muir Patent Law, PLLC

(57) ABSTRACT

Provided are a light source package and a display device including the light source package. The light source package includes a substrate; a light-emitting device mounted on the substrate; a red phosphor layer formed adjacent to a surface of the light-emitting device; and an encapsulation layer for encapsulating the light-emitting device and the red phosphor layer, wherein a phosphor of the red phosphor layer is a fluoride-based red phosphor or a sulfide-based red phosphor. The light source package and the display device including the light source package display excellent color reproduction, without discoloration due to moisture after a long period of time.

19 Claims, 16 Drawing Sheets

(51) Int. Cl.
  *H01L 33/60* (2010.01)
  *H01L 25/075* (2006.01)
  *G02F 1/1335* (2006.01)
  *F21V 8/00* (2006.01)

(52) U.S. Cl.
  CPC ............ *H01L 2224/8592* (2013.01); *H01L 2924/12044* (2013.01); *H01L 2924/181* (2013.01)

(56) References Cited

U.S. PATENT DOCUMENTS

| | | | |
|---|---|---|---|
| 6,645,830 B2 | 11/2003 | Shimoda et al. | |
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,872,659 B2 | 1/2011 | Seetzen | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,304,978 B2 | 11/2012 | Kim et al. | |
| 8,324,646 B2 | 12/2012 | Lee et al. | |
| 8,399,944 B2 | 3/2013 | Kwak et al. | |
| 8,405,304 B2 | 3/2013 | Choi et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 2006/0082296 A1* | 4/2006 | Chua ............... | C09K 11/7718 313/512 |
| 2011/0171765 A1 | 7/2011 | Wang et al. | |
| 2012/0274878 A1 | 11/2012 | Kunz et al. | |

FOREIGN PATENT DOCUMENTS

| | | |
|---|---|---|
| JP | 2012-142430 A | 7/2012 |
| KR | 20-0392880 Y1 | 8/2005 |
| KR | 10-2009-0055402 A | 6/2009 |
| KR | 10-2009-0124216 A | 12/2009 |
| KR | 10-1071378 B1 | 10/2011 |
| KR | 10-1133160 B1 | 4/2012 |
| KR | 10-2013-0074649 A | 7/2013 |

* cited by examiner

FIG. 10

| APPLICATIONS | PHOSPHORS | |
|---|---|---|
| LED TV BLU | $\beta$-SiAlON:Eu$^{2+}$<br>(Ca,Sr)AlSiN$_3$:Eu$^2$<br>L$_3$Si$_6$O$_{11}$:Ce$^{3+}$<br>K$_2$SiF$_6$: Mn$^{4+}$ | 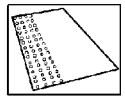 |
| LIGHTING | Lu$_3$Al$_5$O$_{12}$:Ce$^{3+}$<br>Ca-$\alpha$-SiAlON:Eu$^{2+}$<br>L$_3$Si$_6$N$_{11}$:Ce$^{3+}$<br>(Ca,Sr)AlSiN$_3$:Eu$^{2-}$<br>Y$_3$Al$_5$O$_{12}$:Ce$^{3+}$<br>K$_2$SiF$_6$: Mn$^{4+}$ | 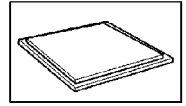 |
| Side view<br>(Mobile, Note PC) | Lu$_3$Al$_5$O$_{12}$:Ce$^{3+}$<br>Ca-$\alpha$-SiAlON:Eu$^{2+}$<br>L$_3$Si$_6$N$_{11}$:Ce$^{3+}$<br>(Ca,Sr)AlSiN$_3$:Eu$^{2-}$<br>Y$_3$Al$_5$O$_{12}$:Ce$^{3+}$<br>(Sr,Ba,Ca,Mg)$_2$SiO$_4$<br>K$_2$SiF$_6$: Mn$^{4+}$ | 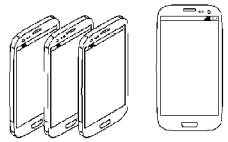 |
| ELECTRIC EQUIPMENT<br>(Head Lamp etc.) | Lu$_3$Al$_5$O$_{12}$:Ce$^{3+}$<br>Ca-$\alpha$-SiAlON:Eu$^{2+}$<br>L$_3$Si$_6$N$_{11}$:Ce$^{3+}$<br>(Ca,Sr)AlSiN$_3$:Eu$^{2-}$<br>Y$_3$Al$_5$O$_{12}$:Ce$^{3+}$<br>K$_2$SiF$_6$: Mn$^{4+}$ | 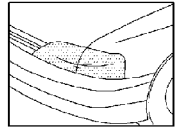 |

LIGHT SOURCE PACKAGE AND DISPLAY DEVICE INCLUDING THE SAME

CROSS-REFERENCE TO RELATED APPLICATIONS

This application claims the benefit of Korean Patent Application No. 10-2014-0015649, filed on Feb. 11, 2014, in the Korean Intellectual Property Office, the disclosure of which is incorporated herein in its entirety by reference.

BACKGROUND

The inventive concept relates to a light source package and a display device including the light source package, and more particularly, to the same including the light source package that exhibits excellent color reproduction, without discoloration due to moisture after a long period of time.

A light-emitting diode (LED) is recently highlighted as a light source of a lighting apparatus, due to its high energy efficiency and appropriate small size. Furthermore, since the LED is used not only in lighting apparatus but also in flat panel displays, optical communication, etc., the LED is more widely used.

A red phosphor to express a red color includes a fluoride-based red phosphor and a sulfide-based red phosphor, and in this regard, since the fluoride-based red phosphor and the sulfide-based red phosphor are extremely vulnerable to moisture, there is an increasing demand for overcoming this problem.

SUMMARY

The inventive concept provides a light source package having excellent color reproduction, without discoloration due to moisture after a long period of time.

The inventive concept also provides a display device having excellent color reproduction, without discoloration due to moisture after a long period of time.

According to an aspect of the inventive concept, there is provided a light source package including a substrate; a light-emitting device mounted on the substrate; a red phosphor layer formed adjacent a surface of the light-emitting device; and an encapsulation layer for encapsulating the light-emitting device and the red phosphor layer. Herein, a phosphor of the red phosphor layer may be a fluoride-based red phosphor or a sulfide-based red phosphor.

The red phosphor layer may further include a green phosphor. The red phosphor layer may be coated on a top surface and a side surface of the light-emitting device. The red phosphor layer may be coated in a hemisphere form on the top surface and the side surface of the light-emitting device.

The red phosphor layer may be conformally coated on the top surface and the side surface of the light-emitting device.

The red phosphor layer may be coated only on a top surface of the light-emitting device. In this example, a blocking layer may be further disposed above the red phosphor layer, and the encapsulation layer may surround the blocking layer. Also, a reflector may be disposed in a side direction of the light-emitting device, and the blocking layer may extend toward a side wall surface of the reflector.

The red phosphor layer may be disposed between the light-emitting device and the substrate.

The light-emitting device may be a blue light-emitting device. The wavelength of a peak of blue light emitted from the light-emitting device may be between about 442 nm and about 457 nm, and after peak normalization is performed, full width at half maximum of the wavelength may be between about 15 nm and about 25 nm. The light source package may further include a green light-emitting device that is adjacent the light-emitting device and mounted on the substrate.

A nitride-based red phosphor or a silicate-based red phosphor may not be included in the encapsulation layer. The red phosphor layer may include a matrix and red phosphors that are substantially and uniformly distributed in the matrix. The matrix may be formed of the same material as that of the encapsulation layer.

According to another aspect of the inventive concept, there is provided a display device that includes a light source package and a color filter layer that receives light emitted from the light source package. The light source package may include a substrate; a light-emitting device mounted on the substrate; a red phosphor layer formed adjacent to a surface of the light-emitting device; and an encapsulation layer for encapsulating the light-emitting device and the red phosphor layer. A phosphor of the red phosphor layer may be a fluoride-based red phosphor or a sulfide-based red phosphor.

The color filter layer may be configured in such a manner that color coordinates of light that has passed the color filter layer may belong to a space surrounded by blue (0.143, 0.043), (0.136, 0.091), (0.155, 0.075), (0.159, 0.0168), green (0.119, 0.659), (0.114, 0.824), (0.176, 0.778), (0.275, 0.691), and red (0.631, 0.314), (0.619, 0.341), (0.647, 0.349), (0.732, 0.261) color coordinates according to the CIE 1931.

BRIEF DESCRIPTION OF THE DRAWINGS

Exemplary embodiments of the inventive concept will be more clearly understood from the following detailed description taken in conjunction with the accompanying drawings in which:

FIG. 10 illustrates phosphor types according to application fields of a white light-emitting device using a blue light-emitting device in the light source package, according to an embodiment of the inventive concept;

DETAILED DESCRIPTION OF THE EMBODIMENTS

Figure 1:
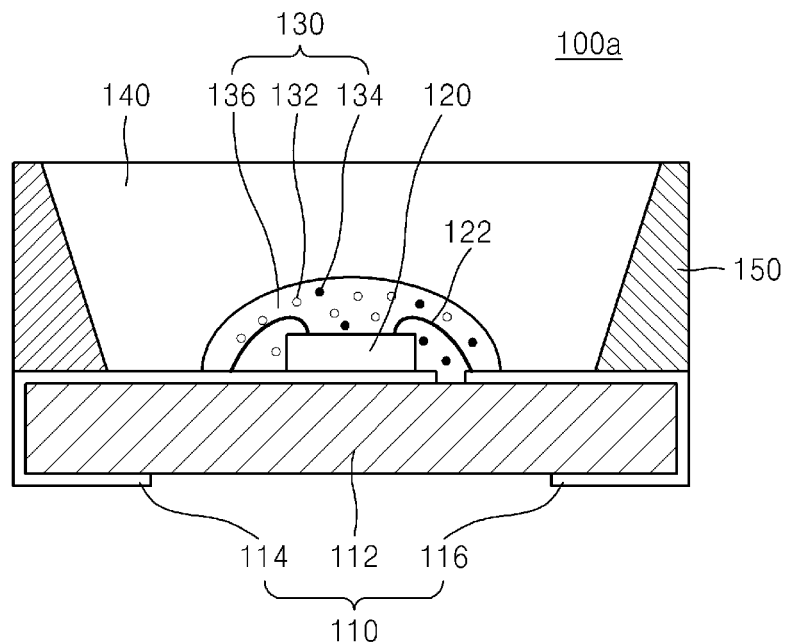
FIG. 1 is a cross-sectional view of a light source package, according to an embodiment of the inventive concept.

The inventive concept will now be described more fully with reference to the accompanying drawings, in which exemplary embodiments of the inventive concept are shown. The inventive concept may, however, be embodied in many different forms and should not be construed as being limited to the embodiments set forth herein; rather, these embodiments are provided so that this disclosure will be thorough and complete, and will fully convey the inventive concept to those of ordinary skill in the art. In the drawings, similar reference numerals denote similar configuring elements, and the thicknesses of layers and regions are exaggerated for clarity.

While terms "first" and "second" are used to describe various components, it is obvious that the components are not limited to the terms "first" and "second". The terms "first" and "second" are used only to distinguish between each component. For example, a first component may indicate a second component or a second component may indicate a first component without conflicting with the inventive concept.

Furthermore, all examples and conditional language recited herein are to be construed as being without limitation to such specifically recited examples and conditions. Throughout the specification, a singular form may include plural forms, unless there is a particular description contrary thereto. Also, terms such as "comprise" or "comprising" are used to specify existence of a number, an operation, a component, and/or groups thereof, not excluding the existence of one or more other numbers, one or more other operations, one or more other components and/or groups thereof.

Unless expressly described otherwise, all terms including descriptive or technical terms which are used herein should be construed as having meanings that are obvious to one of ordinary skill in the art. Also, terms that are defined in a general dictionary and that are used in the following description should be construed as having meanings that are equivalent to meanings used in the related description, and unless expressly described otherwise herein, the terms should not be construed as being ideal or excessively formal.

As used herein, the term "and/or" includes any and all combinations of one or more of the associated listed items. Expressions such as "at least one of," when preceding a list of elements, modify the entire list of elements and do not modify the individual elements of the list.

FIG. 1 is a cross-sectional view of a light source package 100a according to an embodiment of the inventive concept. Referring to FIG. 1, a light-emitting device 120 may be implemented on a substrate 110.

The substrate 110 may include an insulating layer 112, and electrode wiring 114 and 116. The insulating layer 112 may be formed of any material of appropriate mechanical strength and insulation.

For example, a BT resin, glass epoxy, ceramics, or the like may be used. Also, a plurality of epoxy-based resin sheets may be adhered to each other. The electrode wiring 114 and 116 used as a negative electrode and a positive electrode for electrical connection with the light-emitting device 120 may be formed on a surface of the insulating layer 112. The electrode wiring 114 and 116 may be exposed while extending to a side surface and a rear surface of the insulating layer 112 so as to be electrically connected with an external device. Selectively, the electrode wiring 114 and 116 may extend to the rear surface via a through hole that penetrates through the insulating layer 112. The electrode wiring 114 and 116 may be formed of a material such as copper (Cu), nickel (Ni), silver (Ag), or a combination thereof. In particular, an outermost surface of each of the electrode wiring 114 and 116 may include a reflective metal layer so as to increase light extraction efficiency by highly reflecting light. The reflective metal layer may include Ag.

The substrate 110 onto which the light-emitting device 120 is mounted may be formed of a material having excellent heat dissipation and light reflection. The substrate 110 may be formed as a metal substrate as shown in FIG. 2.

Figure 2:
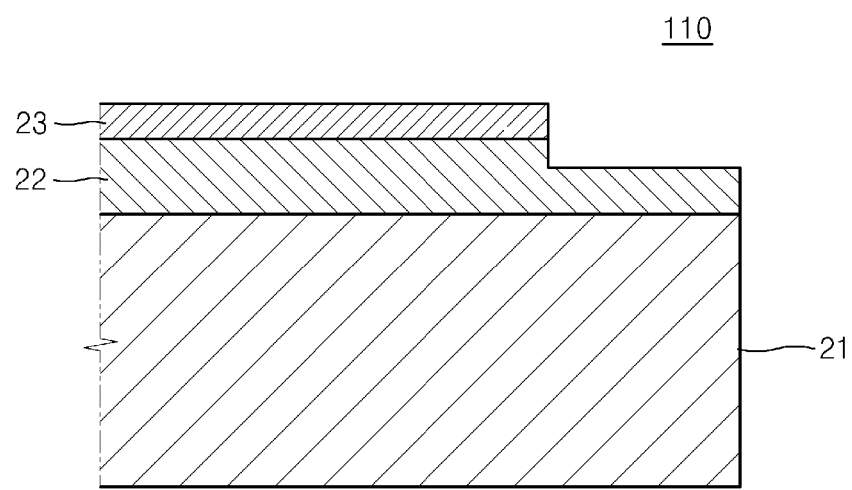
FIGS. 2 through 7 are cross-sectional views of structures of a substrate included in the light source package, according to embodiments of the inventive concept.

As illustrated in FIG. 2, the substrate 110 includes an insulating layer 22 formed on a first metal layer 21, and a second metal layer 23 formed on the insulating layer 22. A stepped region to expose the insulating layer 22 is formed at one side end of the metal substrate.

The first metal layer 21 may be formed of a material such as metal or a metal alloy including Al or Fe having excellent heat dissipation, and may have a single-layer structure or a multi-layer structure. The insulating layer 22 may be formed of an insulating material including an inorganic material or an organic material. In the present embodiment, the insulating layer 22 may be formed of an epoxy-based insulating resin including a metal powder such as an Al powder so as to improve thermal conductivity. In general, the second metal layer 23 may be formed of a Cu thin-film.

Figure 3:
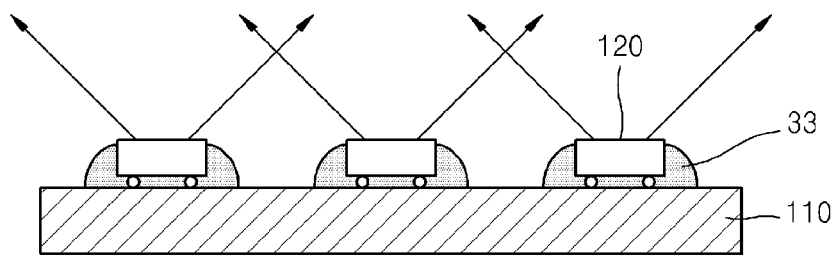

In another embodiment, as illustrated in FIG. 3, the substrate 110 may be a circuit board having a structure in which the light-emitting device 120 is directly mounted on the substrate 110 or a package having the light-emitting device 120 is mounted on the substrate 110, and then a waterproof agent 33 surrounds the package.

Figure 4:
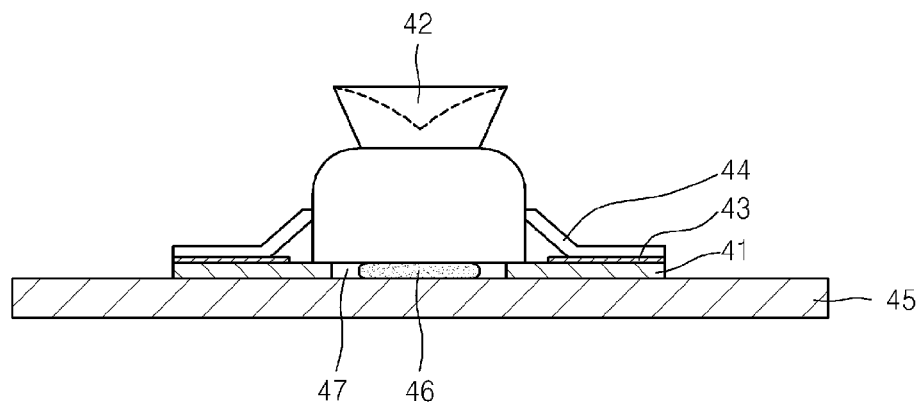

In another embodiment, as illustrated in FIG. 4, a flexible substrate may be provided as a slim-type substrate unit capable of decreasing the thickness and weight of the lighting apparatus, reducing manufacturing costs, and increasing heat dissipation efficiency. The slim-type substrate unit includes a circuit board having one or more through holes formed therein, and light-emitting devices or packages that are coupled to the circuit board via the one or more through holes, respectively. By using the flexible substrate as a substrate material of the slim-type substrate unit, the thickness and weight may be decreased so that slimness and light-weight may be achieved and manufacturing costs may be reduced. Also, since a light-emitting device or the package is directly coupled to a supporting substrate by using a heat dissipation adhesive, dissipation efficiency of heat generated in the light-emitting device or the package may be increased.

Still referring to FIG. 4, the flexible substrate may include a flexible printed circuit board (PCB) 41 in which at least one through hole 47 is formed, a light-emitting device or package 42 coupled onto the flexible PCB 41 via the at least one through hole 47, a supporting substrate 45 to which the flexible PCB 41 is mounted, and a heat dissipation adhesive 46 arranged in the at least one through hole 47 so as to couple a bottom surface of the light-emitting device or package 42 with a top surface of the supporting substrate 45.

The bottom surface of the light-emitting device or package 42 may be a bottom surface of a chip package whose bottom surface of an LED chip is directly exposed, a bottom surface of a lead frame having a top surface to which a chip is mounted, or a metal block.

Figure 5:
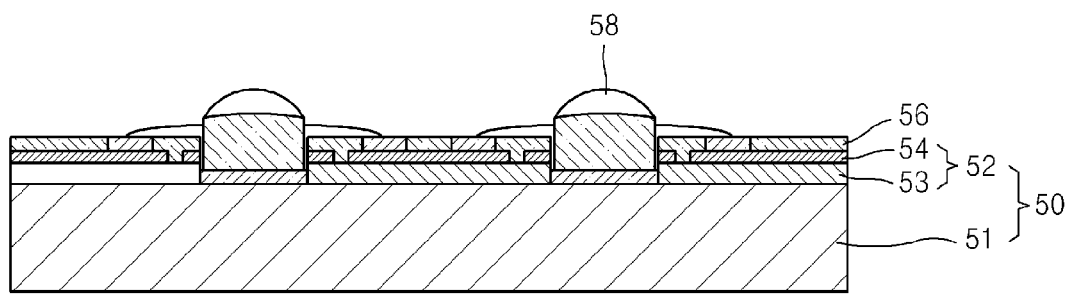

In another embodiment, as illustrated in FIG. 5, a circuit board 50 may have a structure in which a resin coating copper clad laminate (RCC) 52 formed of an insulating layer 53 and a copper thin film layer stacked on the insulating layer 53 is stacked on a heat dissipation supporting substrate 51, and a protective layer 56 formed of a liquid photo solder resist (PSR) is stacked on a circuit layer 54. A portion of the RCC 52 is removed, so that a metal copper clad laminate (MCCL) having at least one groove to which a light-emitting device or package 58 is mounted is formed. In the circuit board 50, an insulating layer at a lower region of the light-emitting device or package 58 at which a light source is positioned is removed, so that the light source contacts the heat dissipation supporting substrate 51, and heat generated in the light source is directly transferred to the heat dissipation supporting substrate 51. Thus heat dissipation is improved.

Figure 6:
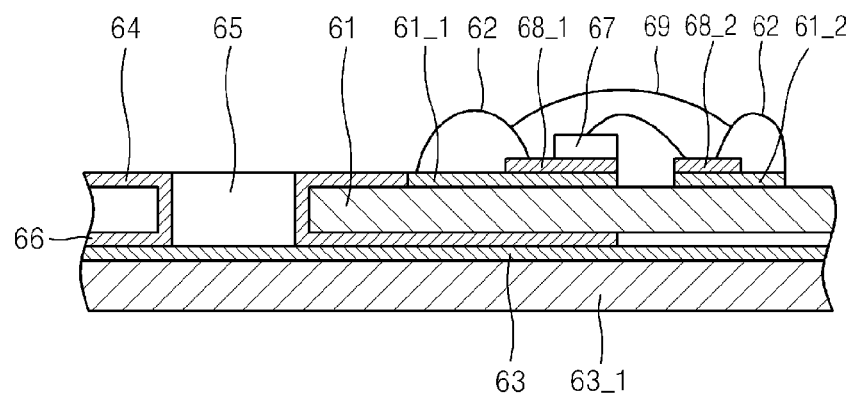

In another embodiment, as illustrated in FIG. 6, a substrate 61 is an insulation substrate and has a structure in which circuit patterns 61_1 and 61_2 formed of a copper laminate are formed on a top surface of the insulation substrate, and an insulation thin film layer 63 thinly coated as an insulation material may be formed on a bottom surface of the insulation substrate. Here, various coating methods such as a sputtering method or a spraying method may be used. Also, top and bottom heat diffusion plates 64 and 66 may be formed on the top and bottom surfaces of the substrate 61 so as to dissipate heat that is generated in an LED module 60, and in particular, the top heat diffusion plate 64 directly contacts the circuit pattern 61_1. For example, the insulation material used as the insulation thin film layer 63 has thermal conductivity that is significantly lower than that of a heat pad. However, since the insulation thin film layer 63 has a very small thickness, the insulation thin film layer 63 may have a thermal resistance that is significantly lower than that of the heat pad. The heat generated in the LED module 60 may be transferred to the bottom heat diffusion plate 66 via the top heat diffusion plate 64 and then may be dissipated to a sash 63_1.

Two through holes 65 may be formed in the substrate 61 and the top and bottom heat diffusion plates 64 and 66 so as to be vertical to the substrate 61. The LED package may include an LED chip 67, LED electrodes 68_1 and 68_2, a plastic molding case 62, a lens 69, or the like. The substrate 61 that is an insulation substrate may have a circuit pattern that is formed by laminating a copper layer onto an FR4-core that is a ceramic or epoxy resin-based material and then by performing an etching process.

The LED module 60 may have a structure in which at least one of a red-light LED that emits red light, a green-light LED that emits green light, and a blue-light LED that emits blue light is mounted, and at least one type of a phosphor material may be coated on a top surface of the blue-light LED.

The phosphor material may be sprayed while including a particle powder that is mixed with a resin. The phosphor powder may be fired and thus may be formed as a ceramic plate layer on the top surface of the blue-light LED. The size of the phosphor powder may be from 1 μm to 50 μm or, for example, from 5 μm to 20 μm. In the case of a nano phosphor, it may be a quantum dot having a size of from 1 nm to 500 nm or, for example, from 10 nm to 50 nm.

Figure 7:
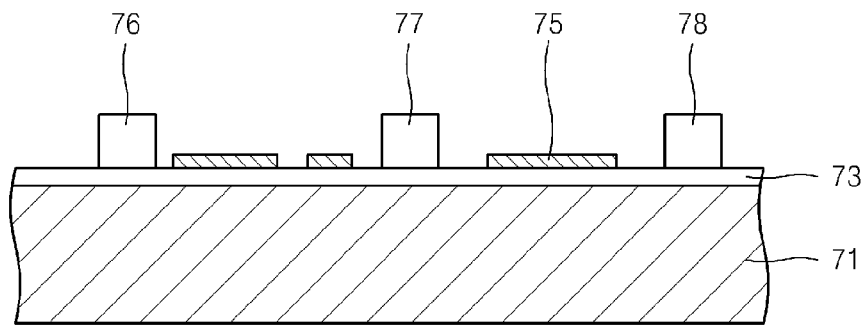

In another embodiment, as illustrated in FIG. 7, a metal substrate 70 may include a metal plate 71 that is formed of Al or an Al alloy, and an Al anodized layer 73 formed on a top surface of the metal plate 71. Heat generation devices 76, 77, and 78 such as LED chips may be mounted on the metal plate 71. The Al anodized layer 73 may insulate a wiring 75 from the metal plate 71.

The metal substrate 70 may be formed of Al or an Al alloy that is relatively less expensive. Alternatively, the metal substrate 70 may be formed of another material such as titanium or magnesium that may be anodized.

The Al anodized layer 73 obtained by anodizing Al has a relatively high heat transfer characteristic of about 10 through 30 W/mK. Thus, the metal substrate 70, including the Al anodized layer 73, may have a heat dissipation characteristic that is superior to that of a polymer substrate-based PCB or an MCPCB according to the related art.

Figure 8:
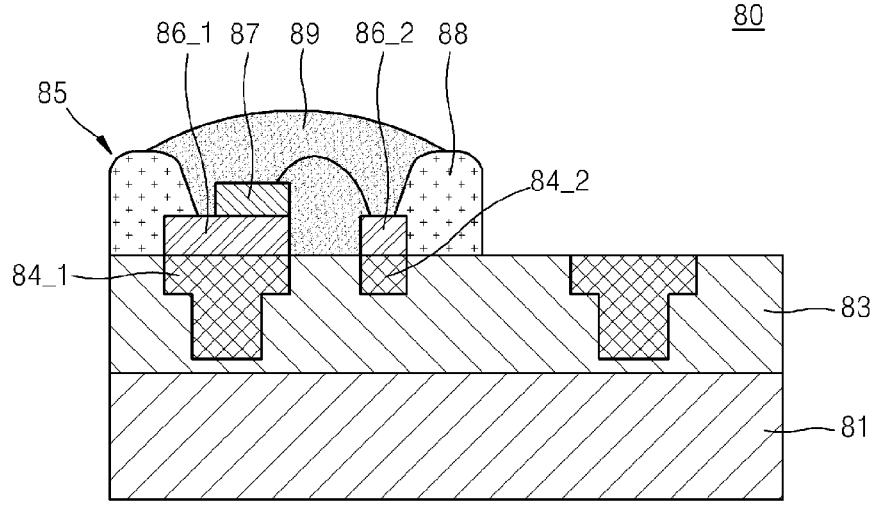
FIG. 8 is a cross-sectional view of a structure of a metal sash that may be included in the light source package, according to an embodiment of the inventive concept.

In another embodiment, as illustrated in FIG. 8, a circuit board 80 includes an insulation resin 83 coated on a metal substrate 81, circuit patterns 84_1 and 84_2 formed in the insulation resin 83, and an LED chip mounted to be electrically connected with the circuit patterns 84_1 and 84_2. Here, the insulation resin 83 having a thickness that is equal to or less than 200 μm may be laminated as a solid-state film on a metal substrate, or may be coated in a liquid state on the metal substrate by spin coating or a molding method using a blade. The size of an insulation resin layer having an insulation circuit pattern may be equal to or less than that of the metal substrate. Also, the circuit patterns 84_1 and 84_2 are formed in a manner in which a metal material such as copper is filled in shapes of the circuit patterns 84_1 and 84_2 that are engraved in the insulation resin 83.

Referring to FIG. 8, an LED module 85 includes an LED chip 87, LED electrodes 86_1 and 86_2, a plastic molding case 88, and a lens 89.

In one embodiment, the light-emitting device 120 may be formed of an LED chip. The LED chip may emit blue light, green light, or red light, according to a type of a compound semiconductor forming the LED chip. Alternatively, the LED chip may emit ultraviolet (UV) rays. In another embodiment, the light-emitting device 120 may be formed of an UV light diode chip, a laser diode chip, or an organic light-emitting device (OLED) chip. However, the light-emitting device 120 may be formed of various light devices other than the aforementioned elements.

The light-emitting device 120 may be configured so that a Color Rendering Index (CRI) can be adjusted from a sodium lamp level (CRI=40) to a solar level (CRI=100) and also may generate a variety of white light in the color temperature range between from about 2,000K to about 20,000K, and when required, the lighting apparatus may adjust a lighting color according to the ambient atmosphere or mood by generating visible light having a purple, blue, green, red, or orange color, or infrared light. Also, the light-emitting device 120 may generate light having a special wavelength capable of promoting a growth of plants.

Figure 9:
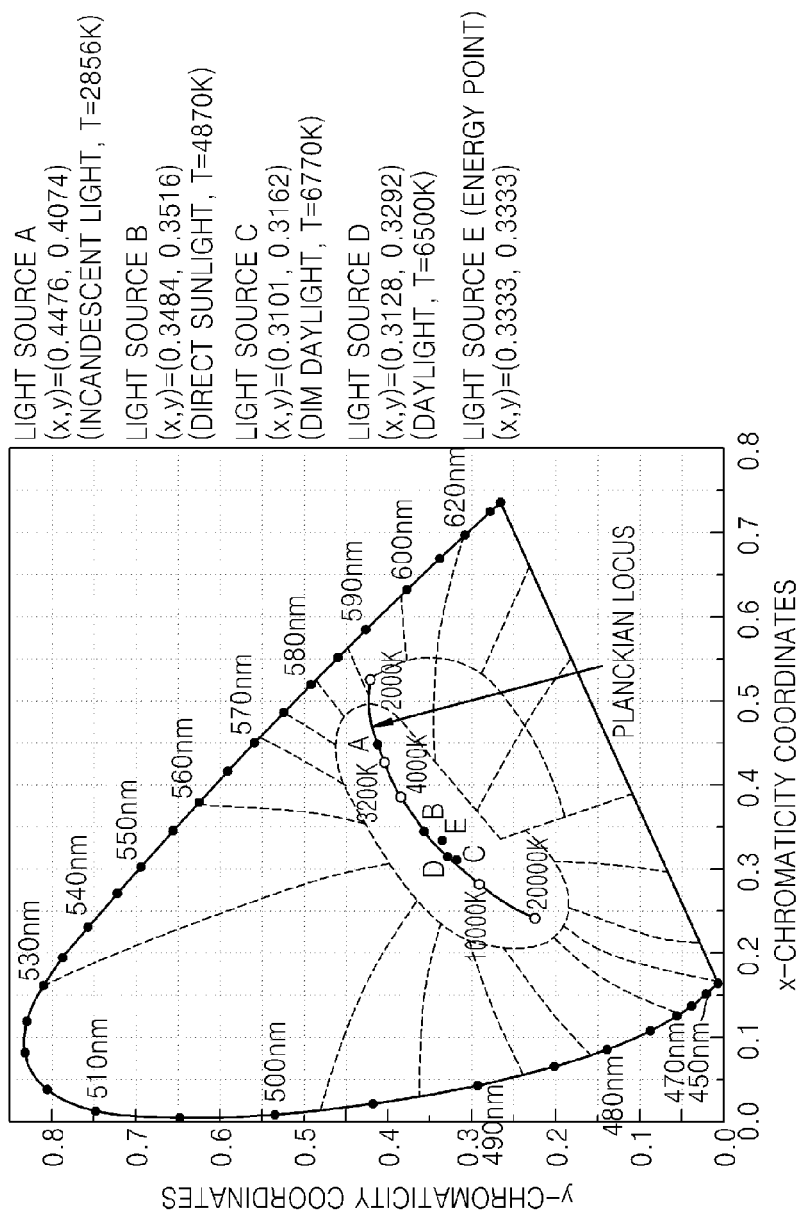
FIG. 9 illustrates a color temperature spectrum related to light that is emitted from a light-emitting device of the light source package, according to an embodiment of the inventive concept.

White light that corresponds to a combination of the blue-light LED and the yellow, green, and red phosphors and/or green and red light-emitting devices may have at least two peak wavelengths and may be positioned at a line segment connecting (x, y) coordinates (0.4476, 0.4074), (0.3484, 0.3516), (0.3101, 0.3162), (0.3128, 0.3292), and (0.3333, 0.3333) of a CIE 1931 coordinate system. Alternatively, the white light may be positioned in a region that is surrounded by the line segment and a black body radiation spectrum. A color temperature of the white light may be between about 2,000K through about 20,000K. FIG. 9 illustrates a color temperature (i.e., a Planckian spectrum).

FIG. 10 illustrates phosphor types according to application fields of a white light-emitting device using a blue-light LED.

Phosphors or quantum dots may be sprayed on an LED chip or a light-emitting device, may be used as a covering in the form of a thin-film, or may be attached in the form of a film-sheet or a ceramic phosphor sheet.

The phosphors or the quantum dots may be sprayed by using a dispensing method, a spray coating method, or the like, and in this regard, the dispensing method includes a pneumatic method and a mechanical method such as a screw, a linear type, or the like. A jetting method may allow a dotting amount control via a minute-amount discharge operation, and a color-coordinates control via the dotting amount control. A method of collectively spraying phosphors on a wafer level or a substrate of the light-emitting device may facilitate control of productivity and thickness of the light-emitting device.

The method of covering the phosphors or the quantum dots in the form of a thin-film on the light-emitting device or the LED chip may be performed by electrophoretic deposition method, a screen printing method, or a phosphor molding method, and one of the aforementioned methods may be used according to whether it is required to cover side surfaces of the LED chip.

In order to control efficiency of a long-wavelength light-emitting phosphor that re-absorbs light emitted at a short-wavelength and that is from among at least two types of phosphors having different emission wavelengths, the at least two types of phosphors having different emission wavelengths may be distinguished, and in order to minimize wavelength re-absorption and interference of the LED chip and the at least two types of phosphors, a DBR (ODR) layer may be arranged between layers.

In order to form a uniform coating layer, the phosphors may be arranged in the form of a film or a ceramic sheet and then may be attached on the LED chip or the light-emitting device.

In order to vary a light efficiency and a light distribution characteristic, a light conversion material may be positioned in a remote manner, and here, the light conversion material may be positioned together with a light-transmitting polymer material, a glass material, or the like according to durability and heat resistance of the light conversion material.

Since the phosphor spraying technology performs a major role in the determination of a light characteristic of an LED device, various techniques to control thickness of a phosphor-coated layer, uniform distribution of the phosphors, or the like are being studied. Also, the quantum dot may be positioned at the LED chip or the light-emitting device in the same manner as the phosphors, and in this regard, the quantum dot may be positioned between glass materials or between light-transmitting polymer materials, thereby performing light conversion.

In order to protect the LED chip or the light-emitting device against an external environment or to improve an extraction efficiency of light that is externally emitted from the light-emitting device, a light-transmitting material as a filling material may be arranged on the LED chip or the light-emitting device.

Here, the light-transmitting material may be a transparent organic solvent including epoxy, silicone, a hybrid of epoxy and silicone, or the like, and may be used after being hardened via heating, light irradiation, a time-elapse, or the like.

With respect to silicone, polydimethyl siloxane is classified into a methyl-base, and polymethylphenyl siloxane is classified into a phenyl-base, and depending on the methyl-base and the phenyl-base, silicon differs in refractive index, water-permeation rate, light transmittance, lightfastness, and heat-resistance. Also, silicon differs in hardening time according to a cross linker and a catalyst, thereby affecting distribution of the phosphors.

The light extraction efficiency varies according to a refractive index of the filling material, and in order to minimize a difference between a refractive index of an outermost medium of emitted blue light of the LED chip and a refractive index of the blue light that is emitted to the outside air, at least two types of silicon having different refractive indexes may be sequentially stacked.

In general, the methyl-base has the most excellent heat-resistance, and variation due to a temperature increase is decreased in order of the phenyl-base, the hybrid, and epoxy. Silicone may be divided into a gel type, an elastomer type, and a resin type according to a hardness level.

The light-emitting device may further include a lens to radially guide light irradiated from a light source, and in this regard, a pre-made lens may be attached on the LED chip or the light-emitting device, or a liquid organic solvent may be injected into a molding frame in which the LED chip or the light-emitting device is mounted and then may be hardened.

The lens may be directly attached on the filling material on the LED chip or may be separated from the filling material by bonding only an outer side of the light-emitting device and an outer side of the lens. The liquid organic solvent may be injected into the molding frame via injection molding, transfer molding, compression molding, or the like.

According to shape (e.g., a concave shape, a convex shape, a concave-convex shape, a conical shape, a geometrical shape, or the like) of the lens, the light distribution characteristic of the light-emitting device may vary, and the shape of the lens may be changed according to requirements for light efficiency and distribution.

The light-emitting device 120 may be formed of a semiconductor such as a nitride semiconductor. The nitride semiconductor may be represented by the general formula $Al_xGa_yIn_zN$ ($0 \leq x \leq 1$, $0 \leq y \leq 1$, $0 \leq z \leq 1$, $x+y+z=1$). The light-emitting device 120 may be formed by epitaxially growing the nitride semiconductor such as InN, AlN, InGaN, AlGaN, or InGaAlN on a substrate by using a vapor-phase growing method such as an MOCVD method. Also, the light-emitting device 120 may be formed of a semiconductor such as ZnO, ZnS, ZnSe, SiC, GaP, GaAlAs, or AlInGaP, other than the nitride semiconductor. The semiconductor may have a stack structure in which an n-type semiconductor layer, an emission layer, and a p-type semiconductor layer are stacked in this order. The emission layer (i.e., an active layer) may correspond to a stack semiconductor having a multi-quantum well structure, a uni-quantum well structure, or a double-hetero structure. The light-emitting device 120 may emit blue light but is not limited thereto. The light-emitting device 120 may be set to emit light with a random wavelength.

The light source package 100a may be formed as an LED chip having one of various structures or as an LED package including the LED chips and having any of various forms. Hereinafter, various types of the LED chip and the LED package that may be employed in light source packages according to various embodiments of the inventive concept will be described in detail.

LED Chip—First Embodiment

Figure 11:
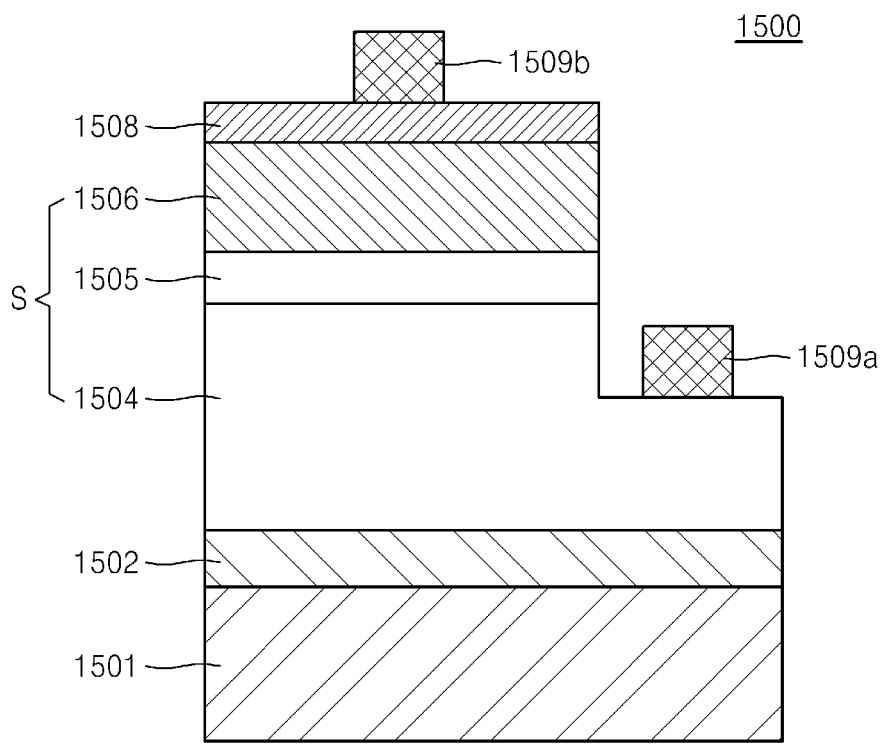
FIGS. 11 through 13 are cross-sectional side views of LED chips that may be used in the light source package, according to embodiments of the inventive concept.

FIG. 11 is a cross-sectional side view of an LED chip 1500 that may be used in the light source package 100*a*, according to an embodiment of the inventive concept.

As illustrated in FIG. 11, the LED chip 1500 includes an emission stack S formed on a substrate 1501. The emission stack S includes a first conductive semiconductor layer 1504, an active layer 1505, and a second conductive semiconductor layer 1506.

Also, the emission stack S includes an ohmic electrode layer 1508 formed on the second conductive semiconductor layer 1506, and a first electrode 1509*a* and a second electrode 1509*b* are formed on top surfaces of the first conductive semiconductor layer 1504 and the ohmic contact layer 1508, respectively.

Throughout the specification, terms such as 'upper', 'top surface', 'lower', 'bottom surface', 'side surface', or the like are based on the drawings; thus, they may be changed according to a direction in which a device is actually disposed.

Hereinafter, major elements of the LED chip 1500 are described in detail.

According to necessity, the substrate 1501 may be formed of an insulating substrate, a conductive substrate, or a semiconductor substrate. For example, the substrate 1501 may be formed of sapphire, SiC, Si, $MgAl_2O_4$, MgO, $LiAlO_2$, $LiGaO_2$, or GaN. For an epitaxial growth of a GaN material, it is preferable to use a GaN substrate that is a homogeneous substrate; however, a GaN substrate has high production cost due to difficulty of manufacture.

An example of a heterogeneous substrate includes a sapphire substrate, a silicon carbide (SiC) substrate, or the like, and in this regard, the sapphire substrate is used more commonly than the SiC substrate, which is expensive. When a heterogeneous substrate is used, defects such as dislocations or the like are increased due to a difference between lattice constants of a substrate material and a thin-film material. Also, due to a difference between thermal expansion coefficients of the substrate material and the thin-film material, the substrate 1501 may be bent when temperature is changed, and the bend causes cracking in a thin-film. The aforementioned problem may be decreased by using a buffer layer 1502 between the substrate 1501 and the emission stack S that includes a GaN material.

In order to improve an optical or electrical characteristic of the LED chip 1500 before or after an LED structure growth, the substrate 1501 may be completely or partly removed or may be patterned while a chip is manufactured.

For example, the sapphire substrate may be separated in a manner in which a laser is irradiated to an interface between the sapphire substrate and a semiconductor layer, and a silicon substrate or the SiC substrate may be removed by using a polishing method, an etching method, or the like.

When the substrate 1501 is removed, another supporting substrate may be used, and the supporting substrate may be bonded to the other side of an original growth substrate by using a reflective metal material or may be formed by inserting a reflection structure into an adhesion layer, so as to improve optical efficiency of the LED chip 1500.

A patterning operation on the substrate is performed by forming an uneven or sloped surface on a main side (e.g., a top surface or both surfaces) or side surfaces of the substrate before or after a growth of an LED structure, and by doing so, light extraction efficiency is improved. The size of a pattern may be selected in a range from 5 nm to 500 μm, and in order to improve light extraction efficiency, a regular pattern or an irregular pattern may be selected. In addition, the shape of the pattern may be a column, a cone, a hemisphere, a polygonal shape, or the like.

The sapphire substrate includes crystals having a hexagonal-rhombohedral (Hexa-Rhombo R3c) symmetry in which lattice constants of the crystal in c-axial and a-lateral directions are 13.001 and 4.758, respectively, and the crystal has a C (0001) surface, an A (1120) surface, an R (1102) surface, or the like. In this case, the C (0001) surface easily facilitates the growth of a nitride thin-film, and is stable at a high temperature, so that the C (0001) surface is commonly used as a substrate for the growth of nitride.

The substrate is formed as a Si substrate that is more appropriate for a large diameter and has a relatively low price, so that mass production may be improved. However, since the Si substrate having a (111) surface as a substrate surface has a lattice constant difference of about 17% with GaN, a technique is required to suppress occurrence of a defective crystal due to the lattice constant difference. In addition, the thermal expansion difference between silicon and GaN is about 56%, so that a technique is required to suppress wafer bend caused due to the thermal expansion difference. Due to the wafer bend, a GaN thin-film may have a crack, and it may be difficult to perform process control such that dispersion of emission wavelength in a same wafer may be increased.

Since the Si substrate absorbs light generated in a GaN-based semiconductor, the external quantum efficiency of the light-emitting device 10 may deteriorate, so that, the Si substrate is removed when required, and a supporting substrate such as Si, Ge, SiAl, ceramic, or metal substrates including a reflective layer may be additionally formed and then may be used.

When the GaN thin-film is grown on a heterogeneous substrate such as the Si substrate, dislocation density may be increased due to a mismatch between lattice constants of a substrate material and a thin-film material, and the crack and bend may occur due to thermal expansion difference. In order to prevent dislocation and crack of the emission stack S, the buffer layer 1502 is disposed between the substrate 1501 and the emission stack S. The buffer layer 1502 decreases dispersion of the emission wavelength of the wafer by adjusting a bending level of the substrate while the active layer is grown.

The buffer layer 1502 may be formed of $Al_xIn_yGa_{(1-x-y)}N$ ($0 \leq x \leq 1$, $0 \leq y \leq 1$, $0 \leq x+y \leq 1$), in particular, GaN, AlN, AlGaN, InGaN, or InGaNAlN, and when required, the buffer layer 1502 may be formed of ZrB2, HfB2, ZrN, HfN, TiN, or the like. Also, the buffer layer 1502 may be formed by combining a plurality of layers or by gradually varying composition of one of the aforementioned materials.

Since the Si substrate and the GaN thin-film has the large thermal expansion difference, when the GaN thin-film is grown on the Si substrate, the GaN thin-film is grown at a high temperature and then is cooled at room temperature, and at this time, tensile stress may be applied to the GaN thin-film due to the thermal expansion difference between the Si substrate and the GaN thin-film, such that a crack in the GaN thin-film may easily occur. In order to prevent the crack, a compressive stress may be applied to the GaN thin-film while the GaN thin-film is grown, so that the tensile stress may be compensated.

Due to lattice constant difference between the Si substrate and the GaN thin-film, the Si substrate may be defective. When a Si substrate is used, a buffer layer having a composite structure is used so as to simultaneously perform defect and stress control to suppress the bend.

For example, AlN is first formed on the substrate 1501. In order to prevent reaction between Si and Ga, it is required to use a material that does not contain Ga. Not only AlN but also SiC may be used. AlN is grown by using Al and N sources at a temperature between 400 through 1300 degrees. When required, an AlGaN intermediate layer may be inserted into a plurality of AlN layers so as to control a stress.

The emission stack S having a multi-layer structure of the group-III nitride semiconductor is now described in detail. The first and second conductive semiconductor layers 1504 and 1506 may be formed of semiconductors that are doped with n-type and p-type impurities, respectively, or vice versa. For example, each of the first and second conductive semiconductor layers 1504 and 1506 may be formed of, but are not limited to, the group-III nitride semiconductor, e.g., a material having a composition of $Al_xIn_yGa_{(1-x-y)}N$ ($0 \leq x \leq 1$, $0 \leq y \leq 1$, $0 \leq x+y \leq 1$). In another embodiment, each of the first and second conductive semiconductor layers 1504 and 1506 may be formed of a material including an AlGaInP-based semiconductor, an AlGaAs-based semiconductor, or the like.

Each of the first and second conductive semiconductor layers 1504 and 1506 may have a single-layer structure. However, when required, each of the first and second conductive semiconductor layers 1504 and 1506 may have a multi-layer structure including a plurality of layers having different compositions or thicknesses. For example, each of the first and second conductive semiconductor layers 1504 and 1506 may have a carrier injection layer capable of improving efficiency of electron and hole injection, and may also have a superlattice structure of various forms.

The first conductive semiconductor layer 1504 may further include a current diffusion layer (not shown) that is adjacent to the active layer 1505. The current diffusion layer may have a structure in which a plurality of $In_xAl_yGa_{(1-x-y)}N$ layers having different compositions or different impurity ratios are repeatedly stacked, or may be partially formed of an insulation material layer.

The second conductive semiconductor layer 1506 may further include an electron block layer that is adjacent to the active layer 1505. The electron block layer may have a structure in which a plurality of $In_xAl_yGa_{(1-x-y)}N$ layers having different compositions are stacked or may have at least one layer formed of $Al_yGa_{(1-y)}N$. Since the electron block layer has a bandgap larger than that of the active layer 1505, the electron block layer prevents electrons from entering to the second conductive semiconductor layer 1506 (that is a p-type).

The emission stack S may be formed by using an MOCVD apparatus. In more detail, the emission stack S is formed in a manner in which a reaction gas such as an organic metal compound gas (e.g., trimethyl gallium (TMG), trimethyl aluminum (TMA), or the like) and a nitrogen containing gas (e.g. ammonia (NH3) or the like) are injected into a reaction container in which the substrate 1501 is arranged and the substrate 1501 is maintained at a high temperature of about 900 through 1100 degrees, while a gallium-based compound semiconductor is grown on the substrate 1501, if required, an impurity gas is injected, so that the gallium-based compound semiconductor is stacked as an undoped-type, an n-type, or a p-type. Si is well known as n-type impurity. Zn, Cd, Be, Mg, Ca, Ba, or the like, in particular, Mg and Zn, may be used as p-type impurity.

The active layer 1505 that is disposed between the first and second conductive semiconductor layers 1504 and 1506 may have a multi-quantum well (MQW) structure in which a quantum well layer and a quantum barrier layer are alternately stacked. For example, in a case of a nitride semiconductor, the active layer 1505 may have a GaN/InGaN structure. However, in another embodiment, the active layer 1505 may have a single-quantum well (SQW) structure.

The ohmic electrode layer 1508 may decrease ohmic contact resistance by relatively increasing impurity density, so that the ohmic electrode layer 1508 may decrease operating voltage and improve a device characteristic. The ohmic electrode layer 1508 may be formed of GaN, InGaN, ZnO, or a graphene layer.

The first electrode 1509a or the second electrode 1509b may include a material such as Ag, Ni, Al, Rh, Pd, Ir, Ru, Mg, Zn, Pt, Au, or the like, or may have a multi-layer structure including Ni/Ag, Zn/Ag, Ni/Al, Zn/Al, Pd/Ag, Pd/Al, Ir/Ag, Ir/Au, Pt/Ag, Pt/Al, Ni/Ag/Pt, or the like.

While the LED chip 1500 shown in FIG. 11 has a structure in which the first electrode 1509a, the second electrode 1509b, and a light extraction surface face the same side, the LED chip 1500 may have various structures such as a flip-chip structure in which the first electrode 1509a and the second electrode 1509b face the opposite side of the light extraction surface, a vertical structure in which the first electrode 1509a and the second electrode 1509b are formed on opposite surfaces, a vertical and horizontal structure employing an electrode structure in which a plurality of vias are formed in a chip so as to increase an efficiency of current distribution and heat dissipation.

LED Chip—Second Embodiment

Figure 12:
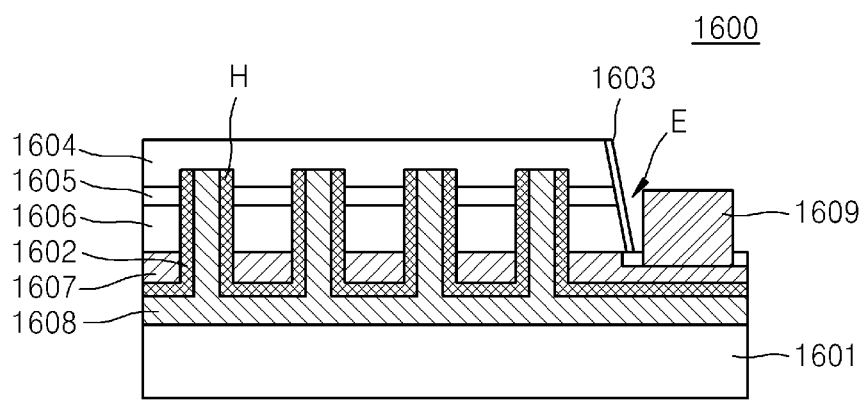

FIG. 12 illustrates an LED chip 1600 having a structure useful for increasing efficiency of current distribution and heat dissipation, when a large area light-emitting device chip for a high output for a lighting apparatus is manufactured, according to another embodiment of the inventive concept.

As illustrated in FIG. 12, the LED chip 1600 includes a first conductive semiconductor layer 1604, an active layer 1605, a second conductive semiconductor layer 1606, a second electrode layer 1607, an insulating layer 1602, a first electrode layer 1608, and a substrate 1601. Here, in order to be electrically connected to the first conductive semiconductor layer 1604, the first electrode layer 1608 includes one or more contact holes H that are electrically insulated from the second conductive semiconductor layer 1606 and the active layer 1605 and that extend from a surface of the first electrode layer 1608 to a portion of the first conductive semiconductor layer 1604. In the present embodiment, the first electrode layer 1608 is not an essential element.

The contact hole H extends from an interface of the first electrode layer 1608 to an inner surface of the first conductive semiconductor layer 1604 via the second conductive semiconductor layer 1606 and the active layer 1605. The contact hole H extends to an interface between the active layer 1605 and the first conductive semiconductor layer 1604, and more preferably, the contact hole H extends to the portion of the first conductive semiconductor layer 1604. Since the contact hole H functions to perform electrical connection and current distribution of the first conductive semiconductor layer 1604, the contact hole H achieves its purpose when the contact hole H contacts the first conductive semiconductor layer 1604, and thus, it is not required for the contact hole to extend to an outer surface of the first conductive semiconductor layer 1604.

The second electrode layer 1607 that is formed on the second conductive semiconductor layer 1606 may be of a material selected from the group consisting of Ag, Ni, Al, Rh, Pd, Ir, Ru, Mg, Zn, Pt, and Au, in consideration of a light reflection function and an ohmic contact with the second conductive semiconductor layer 1606, and may be formed via a sputtering process or a deposition process.

The contact hole H has a shape that penetrates through the second electrode layer 1607, the second conductive semiconductor layer 1606, and the active layer 1605 so as to be connected with the first conductive semiconductor layer 1604. The contact hole H may be formed via an etching process using ICP-RIE or the like.

The insulating layer 1602 is formed to cover side walls of the contact hole H and a top surface of the second conductive semiconductor layer 1606. In this case, a portion of the first conductive semiconductor layer 1604 that corresponds to a bottom surface of the contact hole H may be exposed. The insulating layer 1602 may be formed by depositing an insulation material such as $SiO_2$, $SiO_xN_y$, $Si_xN_y$, or the like. The insulating layer 1602 may be deposited with a thickness range from about 0.01 μm to about 3 μm at a temperature of 500° C. or less via a CVD process.

The second electrode layer 1607 that includes a conductive via formed by filling a conductive material is formed in the contact hole H. A plurality of the vias may be formed in a light-emitting device region. The number of vias and a contact area of the vias may be adjusted so that an area of the vias that contacts a first conductive-type semiconductor is within a range between about 1% and about 5% of an area of the light-emitting device region. A planar radius of the area of the vias that contact the first conductive-type semiconductor is within a range between about 5 μm and about 50 μm, and the number of vias may be between 1 and 50 for each light-emitting device region, according to an area of each light-emitting device region. Although the number of vias may vary according to the area of each light-emitting device region, the number of vias may be at least 3. The distance between the vias may correspond to a matrix array of rows and columns in the range between about 100 μm and about 500 μm, and in more detail, in the range between about 150 μm and about 450 μm. When the distance between the vias is less than about 100 μm, the number of vias is increased so that an emission area is relatively decreased such that emission efficiency deteriorates. When the distance is greater than about 500 μm, current spread may be difficult such that emission efficiency may deteriorate. The depth of the contact hole H may vary according to a second semiconductor layer and an active layer and may be in the range between about 0.5 μm and about 5.0 μm.

Afterward, the substrate 1601 is formed on a surface of the first electrode layer 1608. In this structure, the substrate 1601 may be electrically connected to the first conductive semiconductor layer 1604 via the conductive via that contacts the first conductive semiconductor layer 1604.

The substrate 1601 may be formed of a material selected from the group consisting of Au, Ni, Al, Cu, W, Si, Se, GaAs, SiAl, Ge, SiC, AlN, $Al_2O_3$, GaN, and AlGaN, via a plating process, a sputtering process, a deposition process, or an adhesion process. However, a material and a forming method with respect to the substrate 1601 are not limited thereto.

In order to reduce contact resistance of the contact hole H, the total number of contact holes H, the shape of the contact hole H, the pitch of the contact hole H, the contact area of the contact hole H with respect to the first and second conductive semiconductor layers 1604 and 1606, or the like may be appropriately adjusted, and since the contact holes H are arrayed in various forms along rows and columns, current flow may be improved.

LED Chip—Third Embodiment

Since an LED lighting apparatus provides an improved heat dissipation characteristic, it is preferable to apply an LED chip having a small calorific value to the LED lighting apparatus, in consideration of total heat dissipation performance. An example of the LED chip may be an LED chip having a nano structure (hereinafter, referred to as a "nano LED chip").

An example of the nano LED chip includes a core-shell type nano LED chip. The core-shell type nano LED chip generates a relatively small amount of heat due to its small combined density, and increases its emission area by using the nano structure so as to increase emission efficiency. Also, the core-shell type nano LED chip may obtain a non-polar active layer, thereby preventing efficiency deterioration due to polarization, so that a drop characteristic may be improved.

Figure 13:
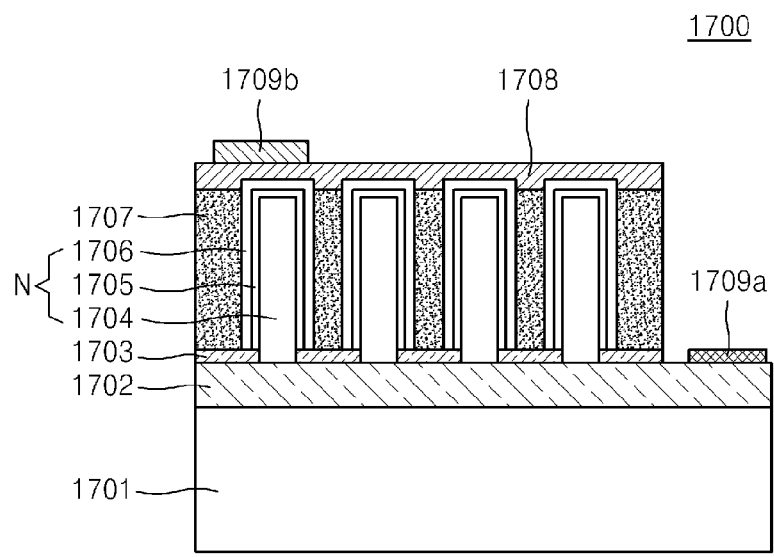

FIG. 13 illustrates a nano LED chip 1700 that may be applied to a tubular-type lighting apparatus, according to another embodiment of the inventive concept.

As illustrated in FIG. 13, the nano LED chip 1700 includes a plurality of nano emission structures N formed on a substrate 1701. In the present embodiment, the nano emission structure N has a rod structure as a core-shell structure, but the nano emission structure N may have a different structure such as a pyramid structure.

The nano LED chip 1700 includes a base layer 1702 formed on the substrate 1701. The base layer 1702 may be a layer to provide a growth surface for the nano emission structures N and may be formed of a first conductive semiconductor. A mask layer 1703 having open areas for a growth of the nano emission structures N (in particular, a core) may be formed on the base layer 1702. The mask layer 1703 may be formed of a dielectric material such as $SiO_2$ or SiNx.

In the nano emission structure N, a first conductive nano core 1704 is formed by selectively growing the first conductive semiconductor using the mask layer 1703 having open areas. An active layer 1705 and a second conductive semiconductor layer 1706 are formed as a shell layer on a surface of the first conductive nano core 1704. By doing so, the nano emission structure N may have a core-shell structure in which the first conductive semiconductor is a nano core, and the active layer 1705 and the second conductive semiconductor layer 1706 that surround the nano core are the shell layer.

In the present embodiment, the nano LED chip 1700 includes a filling material 1707 that fills gaps between the nano emission structures N. The filling material 1707 may structurally stabilize the nano emission structures N. The filling material 1707 may include, but is not limited to, a transparent material such as $SiO_2$. An ohmic contact layer 1708 may be formed on the nano emission structure N so as to contact the second conductive semiconductor layer 1706. The nano LED chip 1700 includes first and second electrodes 1709a and 1709b that contact the base layer 1702, which is formed of the first conductive semiconductor, and the ohmic contact layer 1708, respectively.

By varying diameter, component, or doping density of the nano emission structure N, light having at least two different wavelengths may be emitted from one device. By appropriately adjusting the light having the different wavelengths, white light may be realized in the one device without using a phosphor. In addition, by combining the one device with another LED chip or combining the one device with a wavelength conversion material such as a phosphor, light having desired various colors or white light having different color temperatures may be realized.

LED Chip—Fourth Embodiment

Figure 14:
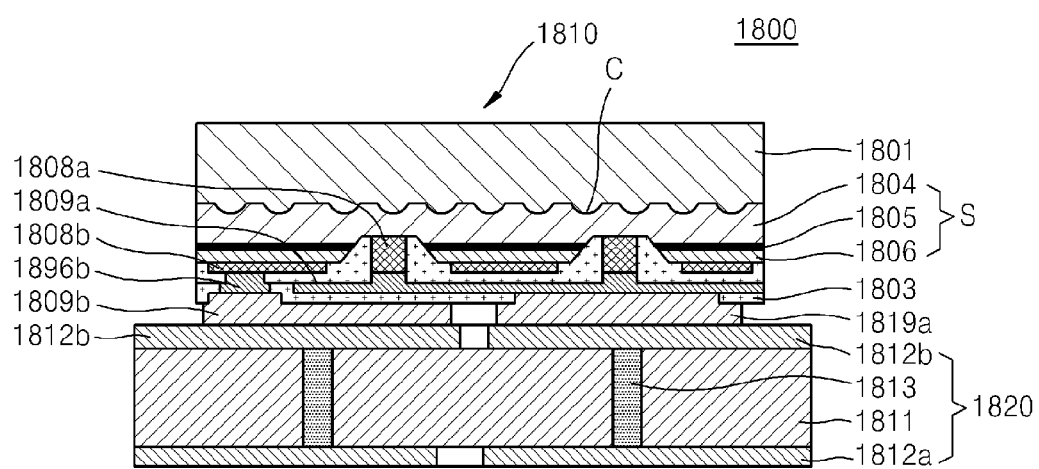
FIGS. 14 and 15 are cross-sectional side views of LED packages including LED chips that may be used in the light source package, according to embodiments of the inventive concept.

FIG. 14 illustrates a semiconductor light-emitting device 1800 that is a light source to be applied to the light source package 100*a* and that includes an LED chip 1810 mounted on a mounting substrate 1820, according to an embodiment of the inventive concept.

The semiconductor light-emitting device 1800 shown in FIG. 14 includes the mounting substrate 1820 and the LED chip 1810 that is mounted on the mounting substrate 1820. The LED chip 1810 is different from the LED chips in the aforementioned embodiments.

The LED chip 1810 includes an emission stack S disposed on a surface of the substrate 1801, and first and second electrodes 1808*a* and 1808*b* disposed on the other surface of the substrate 1801 with respect to the emission stack S. Also, the LED chip 1810 includes an insulation unit 1803 to cover the first and second electrodes 1808*a* and 1808*b*.

The first and second electrodes 1808*a* and 1808*b* may include first and second electrode pads 1819*a* and 1819*b* via first and second electric power connection units 1809*a* and 1809*b*.

The emission stack S may include a first conductive semiconductor layer 1804, an active layer 1805, and a second conductive semiconductor layer 1806 sequentially disposed on the substrate 1801. The first electrode 1808*a* may be provided as a conductive via that contacts the first conductive semiconductor layer 1804 by penetrating through the second conductive semiconductor layer 1806 and the active layer 1805. The second electrode 1808*b* may contact the second conductive semiconductor layer 1806.

A plurality of the vias may be formed in a light-emitting device region. The number of vias and a contact area of the vias may be adjusted so that an area of the vias that contacts a first conductive-type semiconductor is within a range between about 1% and about 5% of an area of the light-emitting device region. A planar radius of the area of the vias that contacts the first conductive-type semiconductor is within a range between about 5 µm and about 50 µm, and the number of vias may be between 1 and 50 vias for each light-emitting device region, according to an area of each light-emitting device region. Although the number of vias may vary according to the area of each light-emitting device region, the number of vias may be at least 3. The distance between the vias may correspond to a matrix array of rows and columns in the range between about 100 µm and about 500 µm, and in more detail, in the range between about 150 µm and about 450 µm. When distance between the vias is less than about 100 µm, the number of vias is increased so that an emission area is relatively decreased such that emission efficiency deteriorates. However, when the distance is greater than about 500 µm, current spread may be difficult such that emission efficiency may deteriorate. The depth of the contact hole H may vary according to a second semiconductor layer and an active layer and may be in the range between about 0.5 µm and about 5.0 µm.

A conductive ohmic material is deposited on the emission stack S so that the first and second electrodes 1808*a* and 1808*b* are formed. The first and second electrodes 1808*a* and 1808*b* may be electrodes each including at least one material selected from the group consisting of Ag, Al, Ni, Cr, Cu, Au, Pd, Pt, Sn, Ti, W, Rh, Ir, Ru, Mg, Zn, and an alloy thereof. For example, the second electrode 1808*b* may be formed as an ohmic electrode including an Ag layer deposited with respect to the second conductive semiconductor layer 1806. The Ag-ohmic electrode functions to reflect light. Selectively, a single layer including Ni, Ti, Pt, or W or a layer of an alloy thereof may be alternately stacked on the Ag layer. In more detail, a Ni/Ti layer, a TiW/Pt layer, or a Ti/W layer may be stacked below the Ag layer or the aforementioned layers may be alternately stacked below the Ag layer.

The first electrode 1808*a* may be formed in such a manner that a Cr layer may be stacked with respect to the first conductive semiconductor layer 1804 and then Au/Pt/Ti layers may be sequentially stacked on the Cr layer, or an Al layer may be stacked with respect to the second conductive semiconductor layer 1806 and then Ti/Ni/Au layers may be sequentially stacked on the Al layer.

In order to improve an ohmic characteristic or a reflective characteristic, the first and second electrodes 1808*a* and 1808*b* may be formed of various materials or may have various stacking structures, other than the aforementioned materials and structures.

The insulation unit 1803 may have an open area to expose a portion of the first and second electrodes 1808*a* and 1808*b*, and the first and second electrode pads 1819*a* and 1819*b* may contact the first and second electrodes 1808*a* and 1808*b*. The insulation unit 1803 may be deposited to have a thickness between about 0.01 µm and about 3 µm via SiO$_2$ and/or SiN CVD processes at a temperature about 500° C. or less.

The first and second electrodes 1808*a* and 1808*b* may be disposed in the same direction, and as will be described later, the first and second electrodes 1808*a* and 1808*b* may be mounted in the form of a flip-chip in a lead frame. In this case, the first and second electrodes 1808*a* and 1808*b* may be disposed to face in the same direction.

In particular, the first electric power connection unit 1809*a* may be formed by the first electrode 1808*a* having a conductive via that penetrates through the active layer 1805 and the second conductive semiconductor layer 1806 and then is connected to the first conductive semiconductor layer 1804 in the emission stack S.

In order to reduce contact resistance between the conductive via and the first electric power connection unit 1809*a*, total number, shapes, pitches, a contact area with the first conductive semiconductor layer 1804, or the like of the conductive via and the first electric power connection unit 1809*a* may be appropriately adjusted, and since the conductive via and the first electric power connection unit 1809*a* are arrayed in rows and columns, current flow may be improved.

An electrode structure of the other side of the semiconductor light-emitting device 1800 may include the second electrode 1808*b* that is directly formed on the second conductive semiconductor layer 1806, and the second electric power connection unit 1809*b* formed on the second electrode 1808*b*. The second electrode 1808*b* may function to form an electrical ohmic connection with the second electric power connection unit 1809*b* and may be formed of a light reflection material, so that, when the LED chip 1810 is mounted as a flip-chip structure, the second electrode 1808*b* may efficiently discharge light, which is emitted from the active layer 1805, toward the substrate 1801. Obviously, according to major light emission direction, the second electrode 1808b may be formed of a light-transmitting conductive material such as transparent conductive oxide.

The aforementioned two electrode structures may be electrically separated from each other by using the insulation unit 1803. Any material or any object having an electrical insulation property may be used as the insulation unit 1803, but it is preferable to use a material having a low light-absorption property. For example, silicon oxide or silicon nitride such as $SiO_2$, $SiO_xN_y$, $Si_xN_y$, or the like may be used. When required, the insulation unit 1803 may have a light reflection structure in which a light reflective filler is distributed throughout a light transmitting material.

The first and second electrode pads 1819a and 1819b may be connected to the first and second electric power connection units 1809a and 1809b, respectively, and thus may function as external terminals of the LED chip 1810. For example, the first and second electrode pads 1819a and 1819b may be formed of Au, Ag, Al, Ti, W, Cu, Sn, Ni, Pt, Cr, NiSn, TiW, AuSn, or a eutectic alloy thereof. In this case, when the first and second electrode pads 1819a and 1819b are mounted on the mounting substrate 1820, the first and second electrode pads 1819a and 1819b may be bonded to the mounting substrate 1820 by eutectic metal, so that a separate solder bump that is generally used in flip-chip bonding would not be used. Compared to a case of using the solder bump, the mounting method using the eutectic metal may achieve a superior heat dissipation effect. In this case, in order to obtain this superior heat dissipation effect, the first and second electrode pads 1819a and 1819b may be formed while having large areas.

The substrate 1801 and the emission stack S may be understood by referring to the aforementioned descriptions, unless contrary description is provided. Also, although not particularly illustrated, a buffer layer may be formed between the emission stack S and the substrate 1801, and in this regard, the buffer layer may be formed as a undoped semiconductor layer including nitride or the like, so that the buffer layer may reduce any lattice defect of an emission structure that is grown on the buffer layer.

The substrate 1801 may have first and second primary surfaces that face each other, and in this regard, a convex-concave structure may be formed on at least one of the first and second primary surfaces. The convex-concave structure arranged on one surface of the substrate 1801 may be formed of the same material as that of the substrate 1801 since a portion of the substrate 1801 is etched, or may be formed of a different material from that of the substrate 1801.

As in the present embodiment, since the convex-concave structure is formed at an interface between the substrate 1801 and the first conductive semiconductor layer 1804, the path of light emitted from the active layer 1805 may vary, such that the rate of light absorbed in the semiconductor layer may be reduced and light-scattering rate may be increased; thus, light extraction efficiency may be improved.

In more detail, the convex-concave structure may have a regular shape or an irregular shape. Heterogeneous materials that form the convex-concave structure may include a transparent conductor, a transparent insulator, or a material having excellent reflectivity. In this regard, the transparent insulator may include, but is not limited to, $SiO_2$, SiNx, $Al_2O_3$, HfO, $TiO_2$, or ZrO, the transparent conductor may include, but is not limited to, TCO such as indium oxide containing ZnO or an additive including Mg, Ag, Zn, Sc, Hf, Zr, Te, Se, Ta, W, Nb, Cu, Si, Ni, Co, Mo, Cr, or Sn, and the reflective material may include, but is not limited to, Ag, Al, or DBR that is formed of a plurality of layers having different refractive indexes.

The substrate 1801 may be removed from the first conductive semiconductor layer 1804. In order to remove the substrate 1801, a laser lift off (LLO) process using a laser, an etching process, or a grinding process may be performed. After the substrate 1801 is removed, the convex-concave structure may be formed on a top surface of the first conductive semiconductor layer 1804.

As illustrated in FIG. 14, the LED chip 1810 is mounted on the mounting substrate 1820. The mounting substrate 1820 has a structure in which upper and lower electrode layers 1812b and 1812a are formed on a top surface and a bottom surface of a substrate body 1811, respectively, and a via 1813 penetrates through the substrate body 1811 so as to connect the upper and lower electrode layers 1812b and 1812a. The substrate body 1811 may be formed of resin, ceramic, or metal, and the upper and lower electrode layers 1812b and 1812a may be metal layers including Au, Cu, Ag, Al, or the like.

Figure 16:
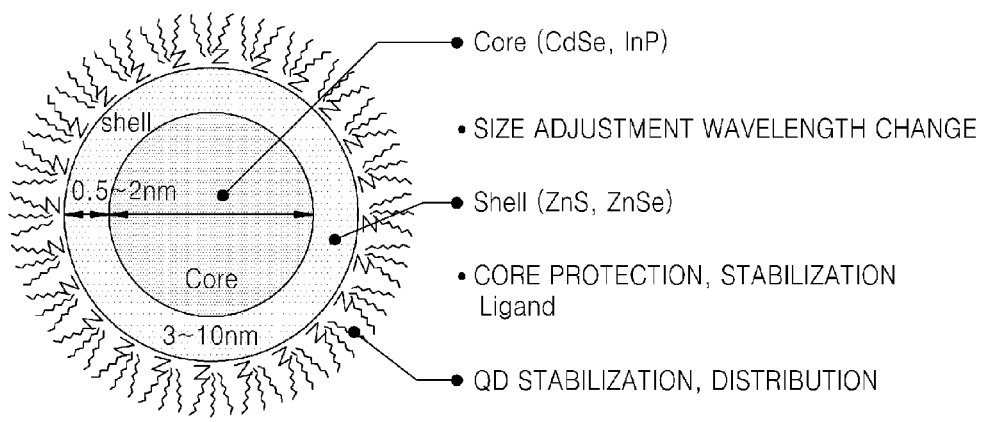
FIG. 16 illustrates a structure of a quantum dot that may be used in the light-emitting device of the light source package, according to an embodiment of the inventive concept.

Obviously, an example of a substrate on which the LED chip 1810 is mounted is not limited to the mounting substrate 1820 of FIG. 16, and thus any substrate having a wiring structure to drive the LED chip 1810 may be used. For example, it is possible to provide a package structure in which the LED chip 1810 is mounted in a package body having a pair of lead frames.

LED Chip—Additional Embodiment

An LED chip having one of various structures may be used, other than the aforementioned LED chips. For example, it is possible to use an LED chip having a light extraction efficiency that is significantly improved by interacting a quantum well exciton and surface-plasmon polaritons (SPP) formed at an interface between metal and dielectric layers of the LED chip.

<LED Package>

The aforementioned various LED chips may be mounted as bare chips on a circuit board and then may be used in a tubular-type light-emitting apparatus. However, unlike this, the LED chips may be also alternatively used in various package structures that are mounted in a package body having a pair of electrodes.

<Example of the LED Package—Chip Scale Package (CSP)>

The example of the LED package that may be used in the light source package 100a may include an LED chip package having a CSP structure.

The CSP may reduce a size of the LED chip package, may simplify the manufacturing process, and may be appropriate for mass production. In addition, an LED chip, wavelength conversion materials such as phosphors, and an optical structure such as a lens may be integrally manufactured, so that the CSP may be designed as appropriate for the lighting apparatus.

Figure 15:
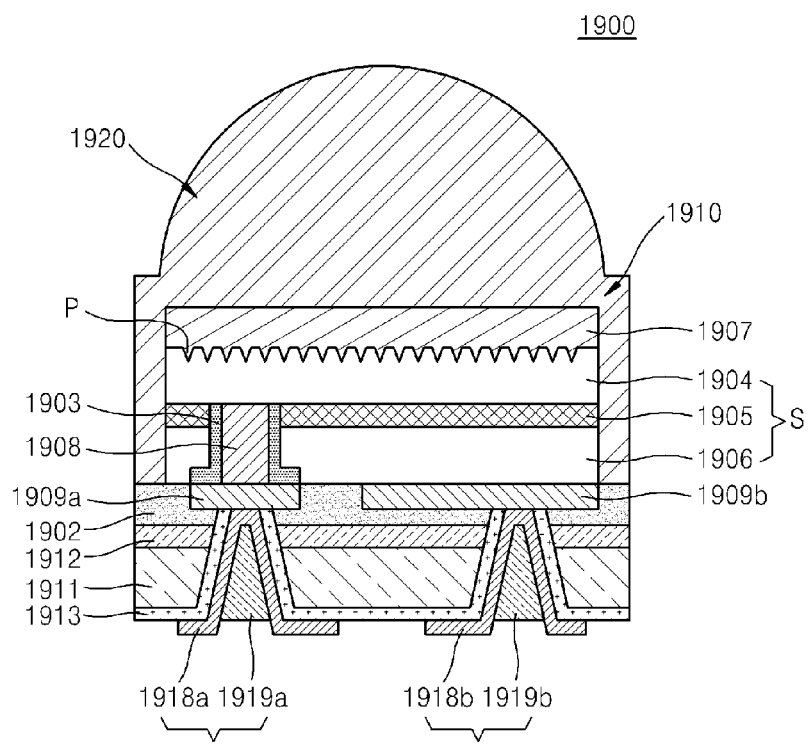

FIG. 15 illustrates an example of a CSP 1900 that has a package structure in which an electrode is formed via a bottom surface of an LED 1910 that is in an opposite direction of a primary light extraction surface, and a phosphor layer 1907 and a lens 1920 are integrally formed, according to an embodiment of the inventive concept.

The CSP 1900 shown in FIG. 15 includes an emission stack S disposed on a mounting substrate 1911, first and second terminals Ta and Tb, the phosphor layer 1907, and the lens 1920.

The emission stack S has a stack structure including first and second conductive semiconductor layers 1904 and 1906, and an active layer 1905 disposed between the first and second conductive semiconductor layers 1904 and 1906. In the present embodiment, the first and second conductive semiconductor layers 1904 and 1906 may be p-type and n-type semiconductor layers, respectively, and may be formed of a nitride semiconductor such as $Al_xIn_yGa_{(1-x-y)}N$ ($0 \le x \le 1$, $0 \le y \le 1$, $0 \le x+y \le 1$). Alternatively, the first and second conductive semiconductor layers 1904 and 1906 may be formed of a GaAs-based semiconductor or a GaP-based semiconductor, other than the nitride semiconductor.

The active layer 1905 disposed between the first and second conductive semiconductor layers 1904 and 1906 may emit light that has a predetermined energy due to recombination of electrons and holes and may have a MQW structure in which a quantum well layer and a quantum barrier layer are alternately stacked. The MQW structure may include an InGaN/GaN structure or a AlGaN/GaN structure.

The first and second conductive semiconductor layers 1904 and 1906, and the active layer 1905 may be formed via a semiconductor layer growing process such as MOCVD, MBE, HVPE, or the like that is well known in the art.

In the LED 1910 shown in FIG. 15, a growth substrate is already removed, and a concave-convex structure may be formed on the surface of the LED 1910 from which the growth substrate is removed. Also, the phosphor layer 1907 is formed as a light conversion layer on the surface whereon the concave-convex structure is formed.

The LED 1910 may have first and second electrodes 1909a and 1909b that contact the first and second conductive semiconductor layers 1904 and 1906, respectively. The first electrode 1909a has a conductive via 1908 that contacts the first conductive semiconductor layer 1904 by penetrating through the second conductive semiconductor layer 1906 and the active layer 1905. The conductive via 1908 has an insulating layer 1903 formed between the active layer 1905 and the second conductive semiconductor layer 1906, thereby preventing a short.

As described above, one conductive via 1908 is arranged, but alternatively, at least two conductive vias 1908 may be arranged for improved current distribution and may be arrayed in various forms.

The mounting substrate 1911 is a supporting substrate such as a silicon substrate to be easily applied to a semiconductor procedure, but examples of the mounting substrate 1911 may vary. The mounting substrate 1911 and the LED 1910 may be bonded to each other via bonding layers 1902 and 1912. The bonding layers 1902 and 1912 may be formed of an electrical insulation material or an electrical conduction material, and in this regard, examples of the electrical insulation material may include oxides such as $SiO_2$, SiN, or the like, or resin materials including silicon resin, epoxy resin, or the like, and examples of the electrical conduction material may include Ag, Al, Ti, W, Cu, Sn, Ni, Pt, Cr, NiSn, TiW, AuSn, or a eutectic metal thereof. The bonding process may be performed in a manner in which the bonding layers 1902 and 1912 are arranged on bonding surfaces of the LED 1910 and the mounting substrate 1911 and then are bonded together.

A via that penetrates through the mounting substrate 1911 is formed at a bottom surface of the mounting substrate 1911 so as to contact the first and second electrodes 1909a and 1909b of the bonded LED 1910. Then, an insulator 1913 may be formed on a side surface of the via and the bottom surface of the mounting substrate 1911. When the mounting substrate 1911 is formed as a silicon substrate, the insulator 1913 may be arranged as a silicon oxide layer that is formed via a thermal oxidation process. By filling the via with a conductive material, the first and second terminals Ta and Tb are formed to be connected to the first and second electrodes 1909a and 1909b. The first and second terminals Ta and Tb may include seed layers 1918a and 1918b, and plating charging units 1919a and 1919b that are formed by using the seed layers 1918a and 1918b via a plating process.

The light-emitting device 120 may be attached on the substrate 110 using a die bond paste or a silver paste. However, eutectic bonding may be alternatively used, and an attaching method is not limited thereto.

Also, the light-emitting device 120 may be electrically connected to the electrode wirings 114 and 116 via a conductive connector 122. The conductive connector 122 may be selected in consideration of an ohmic characteristics, mechanical contactability, electroconductivity, and thermal conductivity between the light-emitting device 120 and the electrode wiring 114 and 116. For example, a gold alloy bonding wire, a silver alloy bonding wire, or a copper bonding wire coated with palladium may be used, or an aluminum wire or a platinum wire may be used. Referring to FIG. 1, a bonding wire is used as the conductive connector 122, but it is obvious to one of ordinary skill in the art that an electrical connecting unit such as a ball bump or a stud bump, in addition to a bonding wire, may be used according to type of light-emitting device 120.

A red phosphor layer 130 is provided adjacent to a surface of the light-emitting device 120. The red phosphor layer 130 includes red phosphors 132 distributed in a matrix 136, and may further include green phosphors 134. The red phosphors 132 may be substantially and uniformly distributed in the matrix 136.

The red phosphor 132 may be a nitride-based red phosphor, a silicate-based red phosphor, a fluoride-based red phosphor, or a sulfide-based red phosphor. In particular, the red phosphor 132 may be fluoride-based red phosphor or sulfide-based red phosphor.

The nitride-based red phosphor may include, but is not limited to, $CaAlSiN_3$:Eu, $CaSiN_2$:Eu, $Ca_2Si_5N_8$:Eu, $Ca_{1-x}AlSiN_3$:$Eu_x$ ($0<x<1$), $Ba_{2-x-z}M_xSi_{5-y}Al_yN_{8-y}O_y$:$Eu_z$ (M=Sr, Ca; $0 \le x \le 1$, $0 \le y \le 4$, $0.0005 \le z \le 0.05$), $(Ca,Sr,Ba)_2Si_5N_8$:Eu, $(Mg,Ca,Sr,Ba)SiN_2$:Eu, $(Mg,Ca,Sr,Ba)AlSiN_3$:Eu, $(Mg,Ca,Sr,Ba)AlSiN_3$:Ce, or $(Ba,Sr,Ca)_xSi_yN_z$:Eu, $(Ba,Sr,Ca)_xSi_yN_z$:Ce (where, each of x, y, z is an integer equal to or greater than 1).

The silicate-based red phosphor may include, but is not limited to, $(Sr, Ca, Ba)_2SiO_4$:Eu, $CaSiO_3(SiO_2)$:$Eu^{2+}$, $CaSiO_3(SiO_2)$:$Mn^{2+}$, $CaSiO_3(SiO_2)_6$:$Eu^{2+}$, $CaSiO_3(SiO_2)_6$:$Mn^{2+}$, $CaSiO_3(SiO_2)_{0.6}$:$Eu^{2+}$, $CaSiO_3(SiO_2)_{0.6}$:$Mn^{2+}$, $(Ba,Sr,Ca,Mg)_2SiO_4$:Eu, $(Ba,Sr,Ca,Mg)_2SiO_4$:Mn, $(Ba,Mg)_2SiO_4$:Eu, $(Ba,Mg)_2SiO_4$:Mn, $LiY_9(SiO_4)_6O_2$:Eu, $Ca_2Y_8(SiO_4)_6O_2$:Eu, $(Sr,Ba,Ca)_3SiO_5$:Eu, $Sr_2BaSiO_5$:Eu, $(Ba_3Mg)Si_2O_8$:Eu, $(Ba_3Mg)Si_2O_8$:Mn, $(Ba,Sr,Ca,Mg)_3(Zn,Mg)Si_2O_8$:Eu, or $(Ba,Sr,Ca,Mg)_3(Zn,Mg)Si_2O_8$:Mn.

The fluoride-based red phosphor may include, but is not limited to, $Li_2[NbF_7]$:$Mn^{4+}$, $Na_2[NbF_7]$:$Mn^{4+}$, $K_2[NbF_7]$:$Mn^{4+}$, $Rb_2[NbF_7]$:$Mn^{4+}$, $Cs_2[NbF_7]$:$Mn^{4+}$, $(NH_4)_2[NbF_7]$:$Mn^{4+}$, $Li_2[TaF_7]$:$Mn^{4+}$, $Na_2[TaF_7]$:$Mn^{4+}$, $K_2[TaF_7]$:$Mn^{4+}$, $Rb_2[TaF_7]$:$Mn^{4+}$, $Cs_2[TaF_7]$:$Mn^{4+}$, $(NH_4)_2[TaF_7]$:$Mn^{4+}$, $Na_3[ScF_6]$:$Mn^{4+}$, $K_3[ScF_6]$:$Mn^{4+}$, $Rb_3[ScF_6]$:$Mn^{4+}$, $Cs_3[ScF_6]$:$Mn^{4+}$, $Na_3[YF_6]$:$Mn^{4+}$, $K_3[YF_6]$:$Mn^{4+}$, $Li_3[BiF_6]$:$Mn^{4+}$, $Na_3[BiF_6]$:$Mn^{4+}$, $K_3[BiF_6]$:$Mn^{4+}$, $Rb_3[BiF_6]$:$Mn^{4+}$, $Cs_3[BiF_6]$:$Mn^{4+}$, $(NH_4)_3[BiF_6]$:$Mn^{4+}$, $Na_3[GdF_6]$:$Mn^{4+}$, $K_3[GdF_6]$:$Mn^{4+}$, $Li_2SiF_6$, $Na_2SiF_6$, $K_2SiF_6$, $Rb_2SiF_6$, $Cs_2SiF_6$, $Li_2TiF_6$, $Na_2TiF_6$, $K_2TiF_6$, $Rb_2TiF_6$, $Cs_2TiF_6$, $Li_2ZrF_6$, $Na_2ZrF_6$, $K_2ZrF_6$, $Rb_2ZrF_6$, $Cs_2ZrF_6$, $Li_2HfF_6$, $Na_2HfF_6$, $K_2HfF_6$, $Rb_2HfF_6$, $Cs_2HfF_6$, $Li_2GeF_6$, $Na_2GeF_6$, $K_2GeF_6$, $Rb_2GeF_6$, $Cs_2GeF_6$, $Li_2SnF_6$, $Na_2SnF_6$, $K_2SnF_6$, $Rb_2SnF_6$, or $Cs_2SnF_6$.

The sulfide-based red phosphor may include, but is not limited to, $(Ga_{1-x}Sr_x)S:Eu^{2+}$ (0<x≤1), $(Ca_{1-x}Sr_x)S:Eu^{2+}$ (0<x≤1), $(Sr_{1-x-y}Ba_xCa_y)_{2-z}Si_{5-a}Al_aN_{8-a}O_a:Eu_z^{2+}$ (0≤a<5, 0<x≤1, 0≤y≤1, and 0<z≤1), $(Gd,Y,Lu,La)_2O_2S:Eu$, $(Gd,Y,Lu,La)_2O_2S:Bi$, $SrY_2S_4:Eu$, or $SrY_2S_4:Ce$.

In particular, the fluoride-based red phosphor may have a wavelength of a peak in the range of about 635 nm through about 655 nm, and after peak normalization is performed, full width at half maximum (FWHM) of the wavelength may be between about 4 nm and about 12 nm. Also, the sulfide-based red phosphor may have a wavelength of a peak in the range of about 635 nm through about 655 nm, and after peak normalization is performed, FWHM of the wavelength may be between about 15 nm and about 40 nm.

The fluoride-based red phosphor and the sulfide-based red phosphor are extremely vulnerable to moisture. Thus, it would be advantageous to block moisture that penetrates from the outside. To do so, the fluoride-based red phosphor and/or the sulfide-based red phosphor is encapsulated in a cell having a glass cover, and then is disposed at a top portion of a light-emitting device, or a red phosphor layer is embedded in a large sheet, which is a very complicated process that requires high cost.

As described above, the red phosphor layer 130 may be formed adjacent to the surface of the light-emitting device 120. For example, the red phosphor layer 130 may be coated on a top surface and a side surface of the light-emitting device 120. Referring to FIG. 1, the red phosphor layer 130 is coated in a hemisphere form on the top surface and the side surface of the light-emitting device 120, however, alternative embodiments are not limited thereto.

As in the embodiment of FIG. 1, with the red phosphor layer 130 being adjacent to the surface of the light-emitting device 120, the distance between a top surface of encapsulation layer 140 and the red phosphors 132 is sufficiently great, such that the red phosphors 132 may be protected against moisture.

For example, phosphors used in an LED may have general formulas and colors as below.

Oxide-based phosphors: yellow color and green color (Y, Lu, Se, La, Gd, Sm)$_3$(Ga, Al)$_5$O$_{12}$:Ce, blue color $BaMgAl_{10}O_{17}:Eu$, $3Sr_3(PO_4)_2.CaCl:Eu$ Silicate-based phosphors: yellow color and green color $(Ba, Sr)_2SiO_4:Eu$, yellow color and orange color $(Ba, Sr)_3SiO_5:Eu$ Nitride-based phosphors: green color β-SiAlON:Eu, red color $(La, Gd, Lu, Y, Sc)_3Si_6N_{11}:Ce$, orange color α-SiAlON:Eu, red color $(Sr, Ca)AlSiN_3:Eu$, $(Sr, Ca)AlSi(ON)_3:Eu$, $(Sr, Ca)_2Si_5N_8:Eu$, $(Sr, Ca)_2Si_5(ON)_8:Eu$, $(Sr, Ba)SiAl_4N_7:Eu$ Sulfide-based phosphors: red color $(Sr, Ca)S:Eu$, $(Y, Gd)_2O_2S:Eu$, green color $SrGa_2S_4:Eu$ Fluoride-based phosphors: KSF-based red color $K_2SiF_6:Mn^{4+}$ In general, the general formulas of the phosphors must match with the stoichiometry, and each element may be substituted for another element in the same group of the periodic table. For example, Sr may be substituted for Ba, Ca, Mg, or the like of the alkaline-earth elements group II, and Y may be substituted for Tb, Lu, Sc, Gd, or the like of lanthanide-base elements. Also, Eu that is an activator may be substituted for Ce, Tb, Pr, Er, Yb or the like according to a desired energy level, and the activator may be solely used or a sub-activator may be additionally used for a characteristic change.

As a substitute for the phosphors, materials such as a quantum dot or the like may be used, and in this case, the LED, the phosphors, and the quantum dot may be combined or the LED and the quantum dot may be used.

The quantum dot may have a structure of a core (from 3 to 10 nm) such as CdSe, InP, or the like, a shell (from 0.5 to 2 nm) such as ZnS, ZnSe, or the like, and a Regand for stabilization of the core and the shell, and may realize various colors according to sizes. FIG. 16 illustrates an example of the structure of the quantum dot.

The light source package 100a includes a reflector 150 that surrounds the light-emitting device 120. The reflector 150 may be formed of any material capable of reflecting light that is emitted from the light-emitting device 120. The material of the reflector 150 may include a thermocurable resin or a thermoplastic. In more detail, the material may include a modified epoxy resin composition such as an epoxy resin composition, a silicon resin composition, or a silicon modified epoxy resin; a modified silicon resin composition such as an epoxy modified silicon resin; or a resin such as a polyimide resin composition, a modified polyimide resin composition, polyphthalamide (PPA), a polycarbonate resin, polyphenylene sulfide (PPS), liquid crystal polymer (LCP), an acrylonitrile butadiene styrene (ABS) resin, a phenol resin, an acryl resin, or a polybutylene terephthalate (PBT) resin. Also, the aforementioned resin may contain a light reflective material such as titanium oxide, silicon dioxide, titanium dioxide, zirconium dioxide, titanium acid potassium, alumina, aluminum nitride, boron nitride, or mullite.

Selectively, in order to increase reflectance, a reflective film may be further arranged on a side wall of the reflector 150 that faces the light-emitting device 120. The reflective film may be a single or composite layer including metal such as gold, silver, platinum, nickel, titanium, or aluminum, or oxides or nitrides thereof.

The light-emitting device 120 may be encapsulated by the encapsulation layer 140. The encapsulation layer 140 may be formed of a material capable of externally transmitting light emitted from the light-emitting device 120. The encapsulation layer 140 may reach transmittance of about 70% or 90% with respect to light emitted from the light-emitting device 120. The material of the encapsulation layer 140 may be equal to or different from the material of the reflector 150. For example, the material of the encapsulation layer 140 may be silicone. The encapsulation layer 140 may not include a sulfide-based red phosphor or a fluoride-based red phosphor. A nitride-based red phosphor or a silicate-based red phosphor may be included in the encapsulation layer 140 or in both the encapsulation layer 140 and the red phosphor layer 130.

The matrix 136 of the red phosphor layer 130 may be formed of the same material as that of the encapsulation layer 140. When the matrix 136 and the encapsulation layer 140 are formed of the same material, their thermal expansion rates are the same. Thus, although temperature is changed, delamination does not occur at an interface between the matrix 136 and the encapsulation layer 140. Thus, excellent light extraction efficiency may be maintained, in spite of temperature variations.

The green phosphors 134 may be distributed in the encapsulation layer 140. In other words, the green phosphors 134 may be distributed only in the encapsulation layer 140, only in the red phosphor layer 130, or in both the encapsulation layer 140 and the red phosphor layer 130.

The wavelength of a peak of blue light that is emitted from the light source package 100a may be between about 442 nm and about 457 nm, and after peak normalization is performed, FWHM of the wavelength may be between about 15 nm and about 25 nm. Since the peak and the FWHM of the wavelength of the blue light are set in the aforementioned manner, excellent color reproduction may be achieved.

The wavelength of the peak of green light emitted from the light source package 100a may be between about 520 nm and about 540 nm, and after peak normalization is performed, FWHM of the wavelength may be between about 15 nm and about 40 nm.

The wavelength of the peak of red light emitted from the light source package 100a may be between about 635 nm and about 655 nm, and after peak normalization is performed, when a fluoride-based phosphor is used, the FWHM of the wavelength may be between about 4 nm and about 12 nm, and when a sulfide-based phosphor is used, the FWHM of the wavelength may be between about 15 nm and about 40 nm.

Figure 17:
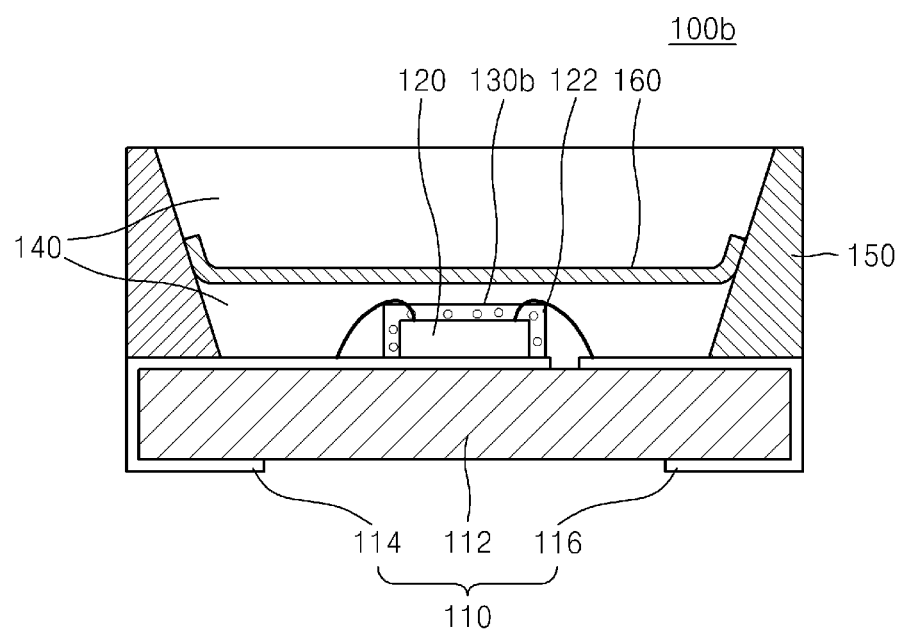
FIGS. 17 through 23 are cross-sectional side views of light source packages, according to embodiments of the inventive concept.

FIG. 17 is a cross-sectional view of a light source package 100b according to another embodiment of the inventive concept. Referring to FIG. 17, a light-emitting device 120 may be mounted on the substrate 110, and a reflector 150 may be disposed in a side direction of the light-emitting device 120. Also, the light-emitting device 120 may be electrically connected to electrode wirings 114 and 116 of the substrate 110 via a conductive connector 122. Since the substrate 110, the light-emitting device 120, the reflector 150, the conductive connector 122, and the encapsulation layer 140 are described in detail with reference to FIG. 1, detailed descriptions thereof are omitted here.

A red phosphor layer 130b may be formed on a surface of the light-emitting device 120, in particular, a top surface and a side surface of the light-emitting device 120. As illustrated in FIG. 2, the red phosphor layer 130b may be provided in a conformal manner on the light-emitting device 120. Here, the term 'conformal' means that thickness of the red phosphor layer 130b is substantially constant along the surface of the light-emitting device 120. The configuration of the red phosphor layer 130b may be equal to that of the red phosphor layer 130 shown in FIG. 1, and thus, detailed descriptions thereof are omitted here.

A blocking layer 160 may be disposed above the red phosphor layer 130b. The blocking layer 160 may prevent moisture from reaching the red phosphor layer 130b. Thus, the blocking layer 160 may be formed on the entire top surface of the red phosphor layer 130b. Also, in order to completely block the moisture, the red phosphor layer 130b may extend in a horizontal direction to a side wall of the reflector 150.

The blocking layer 160 may be formed of a material capable of minimizing light absorption and/or reflection and efficiently blocking moisture. For example, the material of the blocking layer 160 may include, but is not limited to, silicon-based polymer such as polysiloxane; fluorine-based polymer such as polyperfluoroethers, fluorinated polyethers, fluorinated polyimides, fluorinated polyetheretherketones (peek), fluorinated polyamides, or fluorinated polyesters; acrylates polymer such as methyl acrylate, ethyl acrylate, propyl acrylate, butyl acrylate, octyl acrylate, butyl methacrylate, 2-ethylhexylmethacrylate, or octyl methacrylate; a copolymer resin such as an acryl-silicon based copolymer resin, an acryl-fluorine based copolymer resin, or an urethane-silicon-fluorine based copolymer resin; a resin blend of a silicon-based resin and an acryl-based resin; or a resin blend of a fluorine-based resin and an acryl-based resin.

The thickness of the blocking layer 160 may be between about 2 μm and about 80 μm. The encapsulation layer 140 may surround the blocking layer 160. Due to the blocking layer 160, the encapsulation layer 140 may be divided into two portions, i.e., one portion that is above the blocking layer 160 and the other portion that is below the blocking layer 160.

Figure 18:
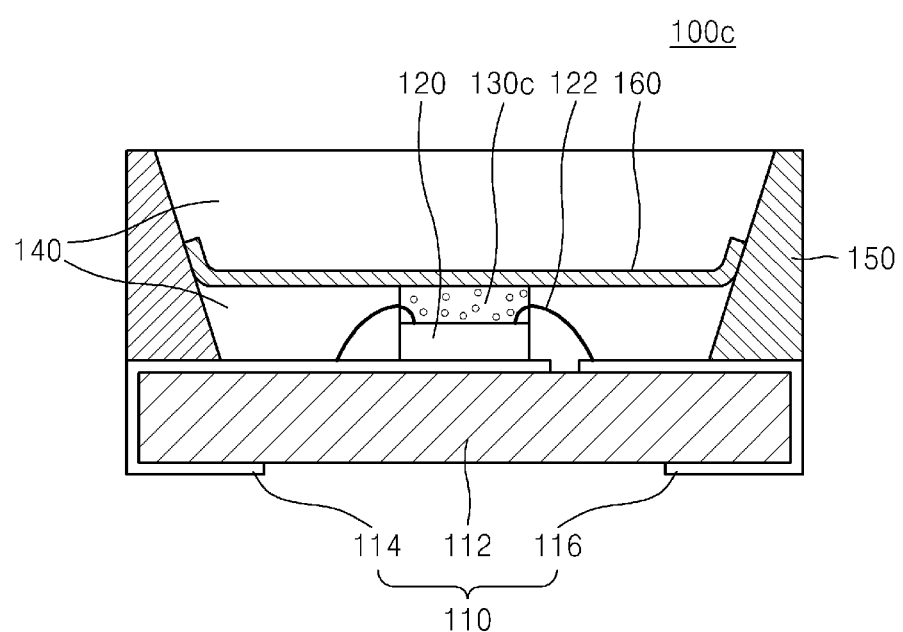

FIG. 18 is a cross-sectional view of a light source package 100c according to another embodiment of the inventive concept. Referring to FIG. 18, a red phosphor layer 130c may be formed only on a top surface of a light-emitting device 120 and not on a side wall of the light-emitting device 120. Referring to FIG. 18, the red phosphor layer 130c is formed on the entire top surface of the light-emitting device 120, but the red phosphor layer 130c may be formed on only a portion of the top surface of the light-emitting device 120.

In the present embodiment, the blocking layer 160 may directly contact the red phosphor layer 130c. That is, a top surface of the red phosphor layer 130c may directly contact a bottom surface of the blocking layer 160. Alternatively, the top surface of the red phosphor layer 130c may indirectly contact the bottom surface of the blocking layer 160 by having an adhesive interposed therebetween.

Since the blocking layer 160 is described in detail with reference to FIG. 17, further descriptions thereof are omitted herein.

Figure 19:
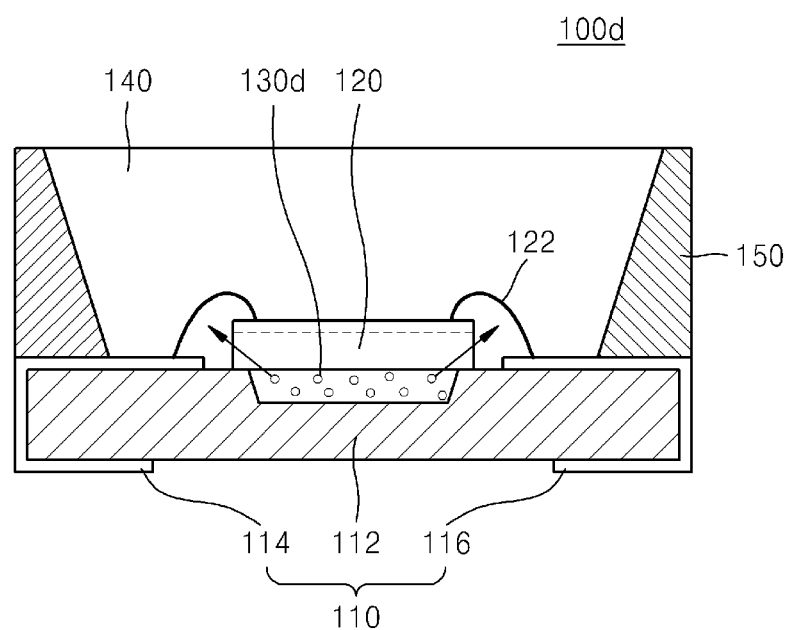

FIG. 19 is a cross-sectional view of a light source package 100d according to another embodiment of the inventive concept. Referring to FIG. 19, a red phosphor layer 130d may be interposed between a light-emitting device 120 and a substrate 110. The red phosphor layer 130d is disposed below the light-emitting device 120, but, since a lower portion of the light-emitting device 120 (i.e., a lower portion below a dashed line shown in FIG. 19) is generally formed of a transparent material, light may be externally emitted as shown by the arrows in FIG. 19.

In the present embodiment, the light-emitting device 120 functions as a blocking layer, and thus, deterioration of phosphors in the red phosphor layer 130d, which occurs due to moisture that penetrates from a surface of an encapsulation layer 140, may be significantly improved.

Referring to FIG. 19, the red phosphor layer 130d is housed in a recess formed in the substrate 110, but the red phosphor layer 130d may be positioned between the substrate 119 and the light-emitting device 120.

Figure 20:
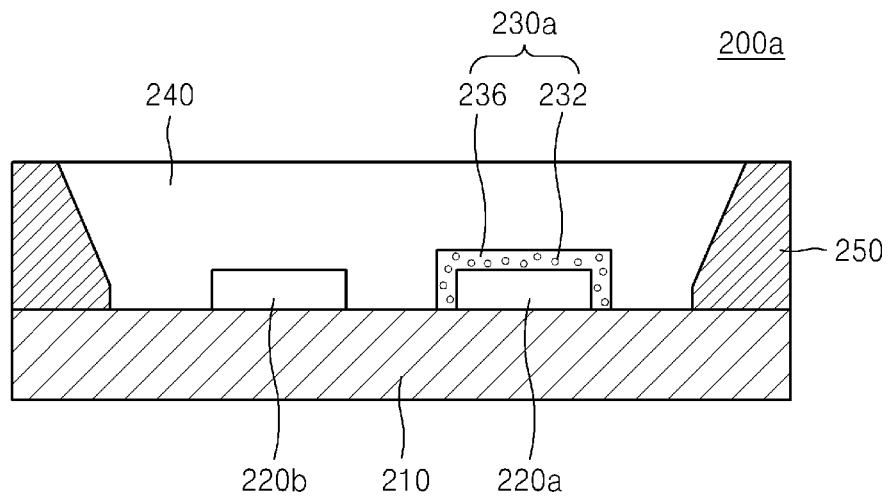

FIG. 20 is a cross-sectional view of a light source package 200a according to another embodiment of the inventive concept. Referring to FIG. 20, a blue light-emitting device 220a and a green light-emitting device 220b may be adjacent to each other and may be mounted on a substrate 210.

Also, a red phosphor layer 230a may be formed on a surface of the blue light-emitting device 220a. The red phosphor layer 230a may include a matrix 236 and red phosphors 232 that are substantially and uniformly distributed in the matrix 236. In the embodiment of FIG. 20, the green light-emitting device 220b is separately arranged, and thus, green phosphors would generally not be included in the red phosphor layer 230a.

Here, the red phosphors 232 may substantially not exist in the encapsulation layer 240.

Figure 21:
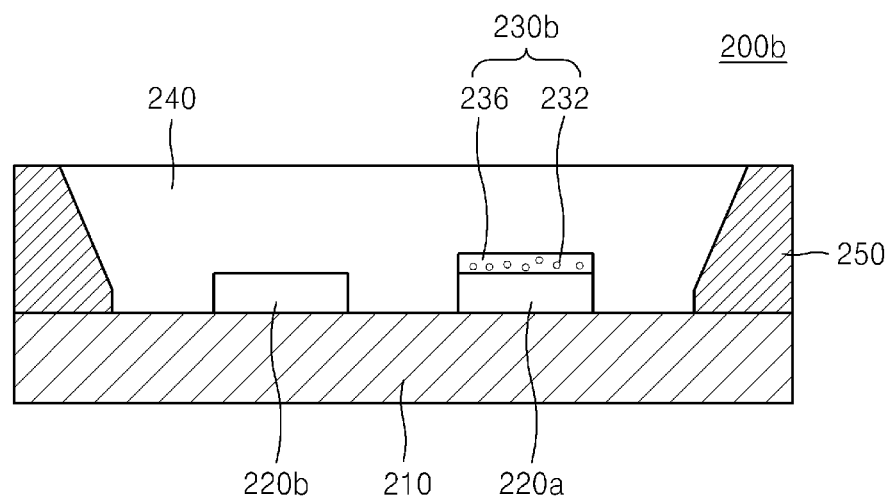

FIG. 21 is a cross-sectional view of a light source package 200b according to another embodiment of the inventive concept. Referring to FIG. 21, a red phosphor layer 230b may be formed only on a top surface of a blue light-emitting device 220a.

Since the red phosphor layer 230b is formed only on the top surface of the blue light-emitting device 220a, the red phosphor layer 230b may be formed via a simpler process than the process of the red phosphor layer 230a of FIG. 20, which is formed on the top surface and the side surface of the blue light-emitting device 220a.

Figure 22:
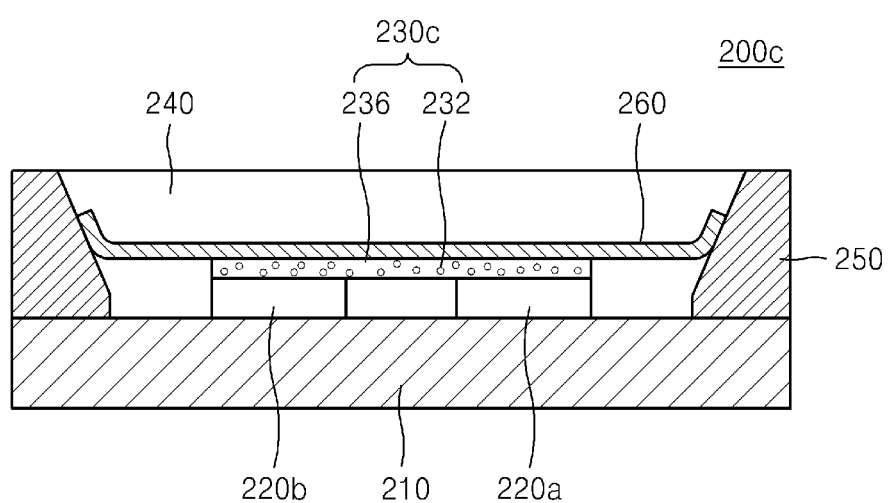

FIG. 22 is a cross-sectional view of a light source package 200c according to another embodiment of the inventive concept. Referring to FIG. 22, a red phosphor layer 230c may extend to cover top surfaces of a blue light-emitting device 220a and a green light-emitting device 220b. By doing so, emissions of blue-color light, red-color light, and green-color light may be further uniform.

As illustrated in FIG. 22, the red phosphor layer 230c may extend between the blue light-emitting device 220a and the green light-emitting device 220b. Referring to FIG. 22, the red phosphor layer 230c extends to cover the top surfaces of the blue light-emitting device 220a and the green light-emitting device 220b, but embodiments are not limited thereto. The red phosphor layer 230c may cover all or part of the top surface of the blue light-emitting device 220a and all or part of the top surface of the green light-emitting device 220b.

Furthermore, a blocking layer 260 may be formed on a top surface of the red phosphor layer 230c. The blocking layer 260 may extend on inner side walls of reflectors 250. Also, as illustrated in FIG. 22, an encapsulation layer 240 may be divided into two portions by the blocking layer 260.

Figure 23:
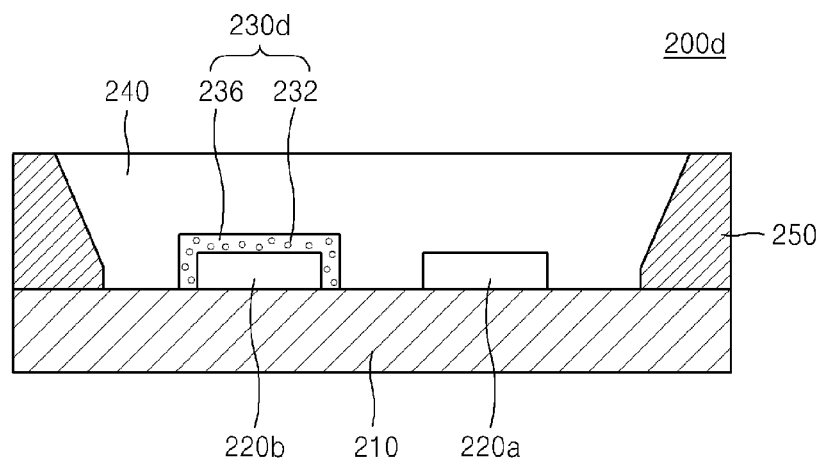

FIG. 23 is a cross-sectional view of a light source package 200d according to another embodiment of the inventive concept. Referring to FIG. 23, a red phosphor layer 230d may be formed not on a surface of a blue light-emitting device 220a but on a surface of a green light-emitting device 220b. Since the embodiment of FIG. 23 is identical to the embodiment of FIG. 20, except for the fact that the red phosphor layer 230d is formed on the surface of the green light-emitting device 220b, not the surface of the blue light-emitting device 220a, detailed descriptions thereof are omitted herein.

Referring to the embodiments of FIGS. 20 through 23, for conciseness of drawings, bonding wires or connection terminals of a substrate are omitted.

The aforementioned technical features may be separately performed or at least two of the technical features may be combined and performed. It is obvious to one of ordinary skill in the art to predict and understand an effect that may be obtained from the combination of the at least two of the technical features, in view of the detailed descriptions.

The one or more embodiments are related to a horizontal-type light-emitting device, but it is obvious to one of ordinary skill in the art to understand that the one or more embodiments may also be applied to a vertical-type light-emitting device.

Figure 24:
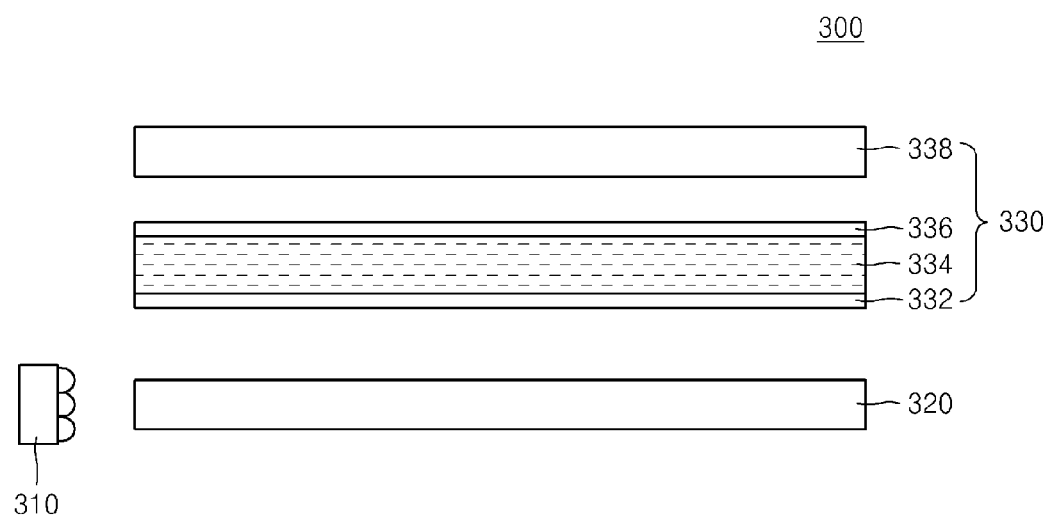
FIG. 24 is a cross-sectional side view of a display device, according to an embodiment of the inventive concept.

FIG. 24 is a cross-sectional view of a display device 300 according to an embodiment of the inventive concept.

Referring to FIG. 24, the display device 300 may include a light source package 310 and a color filter layer 338 on which light emitted from the light source package 310 is incident. Since the light source package 310 is previously described in detail, detailed descriptions thereof are omitted here.

The light that is emitted from the light source package 310 may be externally emitted via a guide plate 320 and a liquid crystal panel 330.

The guide plate 320 may be configured to guide light emitted from the light source package 310 to the liquid crystal panel 330. In addition, a reflective plate may be further formed below the guide plate 320. Also, at least one film selected from the group consisting of a diffusion plate, a prism sheet, a micro-lens sheet, and a brightness enhancement film (e.g., a double brightness enhancement film (DBEF)) may be further formed on a top surface of the guide plate 320.

The liquid crystal panel 330 may have a structure in which a first polarizing plate 332, a liquid crystal layer 334, a second polarizing plate 336, and a color filter layer 338 are sequentially stacked. White light emitted from the light source package 310 passes through the first polarizing plate 332, the liquid crystal layer 334, and the second polarizing plate 336, and then is incident on the color filter layer 338, so that an image with a predetermined color may be realized.

In particular, the color filter layer 338 may be configured so that color coordinates of light that has passed the color filter layer 338 may belong to a space surrounded by blue (0.143, 0.043), (0.136, 0.091), (0.155, 0.075), (0.159, 0.0168), green (0.119, 0.659), (0.114, 0.824), (0.176, 0.778), (0.275, 0.691), and red (0.631, 0.314), (0.619, 0.341), (0.647, 0.349), (0.732, 0.261) color coordinates according to the CIE 1931.

By doing so, the display device 300 according to the present embodiment may have excellent color reproduction, without discoloration due to moisture after a long period of time.

Figure 25A:
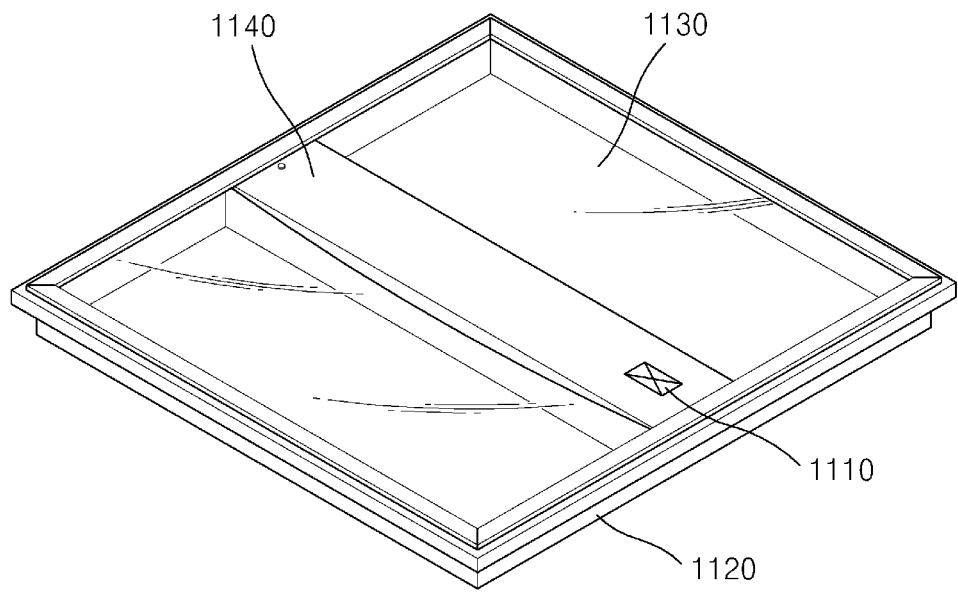
FIGS. 25A through 25C illustrate various lighting apparatuses to which the light source package may be applied, according to embodiments of the inventive concept.
Figure 25B:
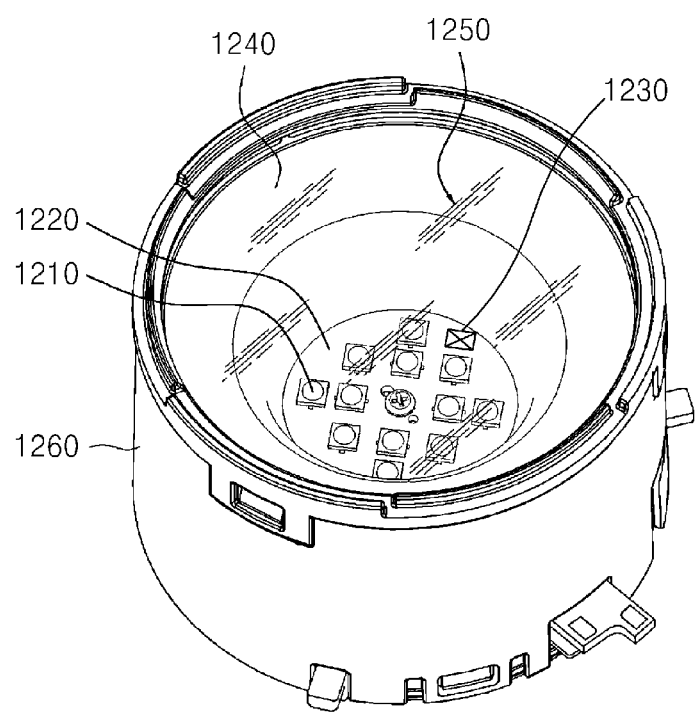
Figure 25C:
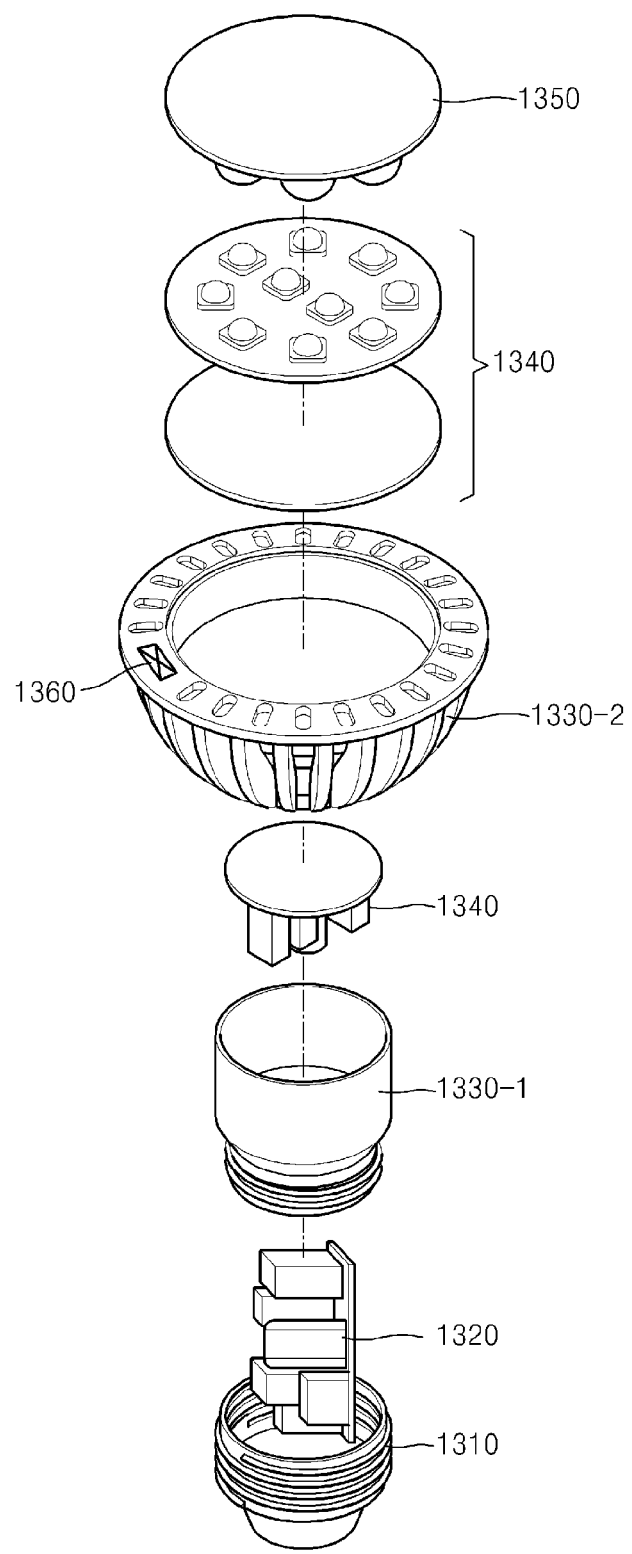

FIGS. 25A through 25C illustrate various lighting apparatuses according to embodiments of the inventive concept.

FIG. 25A illustrates a flat-shape lighting apparatus according to the embodiment of the inventive concept.

Referring to FIG. 25A, the flat-shape lighting apparatus may include a photo sensor module 1110, a housing 1120, a diffusion cover 1130, and a power cover 1140. For reference, a light-emitting module that includes a power device and a light-emitting package may be included in the housing 1120, the diffusion cover 1130, and the power cover 1140. Since the light-emitting package is previously described in detail, detailed descriptions thereof are omitted herein.

FIG. 25B illustrates a cylindrical-shape lighting apparatus according to the embodiment of the inventive concept.

Referring to FIG. 25B, the cylindrical-shape lighting apparatus may include a light-emitting package 1210, a circuit substrate 1220, a photo sensor module 1230, a reflective plate 1240, a diffusion plate 1250, and a body 1260. Since the light-emitting package 1210 is previously described in detail, detailed descriptions thereof are omitted here.

FIG. 25C illustrates a lamp-shape lighting apparatus according to the embodiment of the inventive concept.

Referring to FIG. 25C, the lamp-shape lighting apparatus may include a socket 1310, a power unit 1320, heat dissipation units 1330-1 and 1330-2, a light-emitting package 1340, an optical portion 1350, and a photo sensor module 1360. Since the light-emitting package 1340 is previously described in detail, detailed descriptions thereof are omitted here.

In consideration of influence on human biorhythm, psychological status, academic achievement, work ability, or the like due to ambient illumination, it is possible to design a digital lighting control such as a wireless (remote) control or artificial intelligence sensing on color, temperature, brightness, or the like of illumination, by using a portable device such as a smartphone.

For example, for a math class, blue illumination having a color temperature CCT of about 7600 through about 8000 Kelvin (K) is highly effective, for a language class, general illumination having a CCT of about 4200 through about 4600K is highly effective, and for art and music classes, red illumination having a CCT of about 2200 through about 2600K is highly effective, and by providing optimized color illumination based on an influence of brightness and color temperature of illumination with respect to brain waves and psychological statuses, it is possible to provide a customized lighting apparatus so as to improve study and work efficiency.

Also, by adding a communication function to LED lighting apparatuses and display devices, it is possible to achieve a visible-light wireless communication technology to simultaneously use LED lighting apparatuses for both their intended purpose as an LED light source and an additional purpose as a communication means. This is because the LED light source is advantageous in that the LED light source has a long lifetime and excellent electric power efficiency, realizes various colors, has a fast switching speed for digital communication, and may be digitally controlled.

Figure 26:
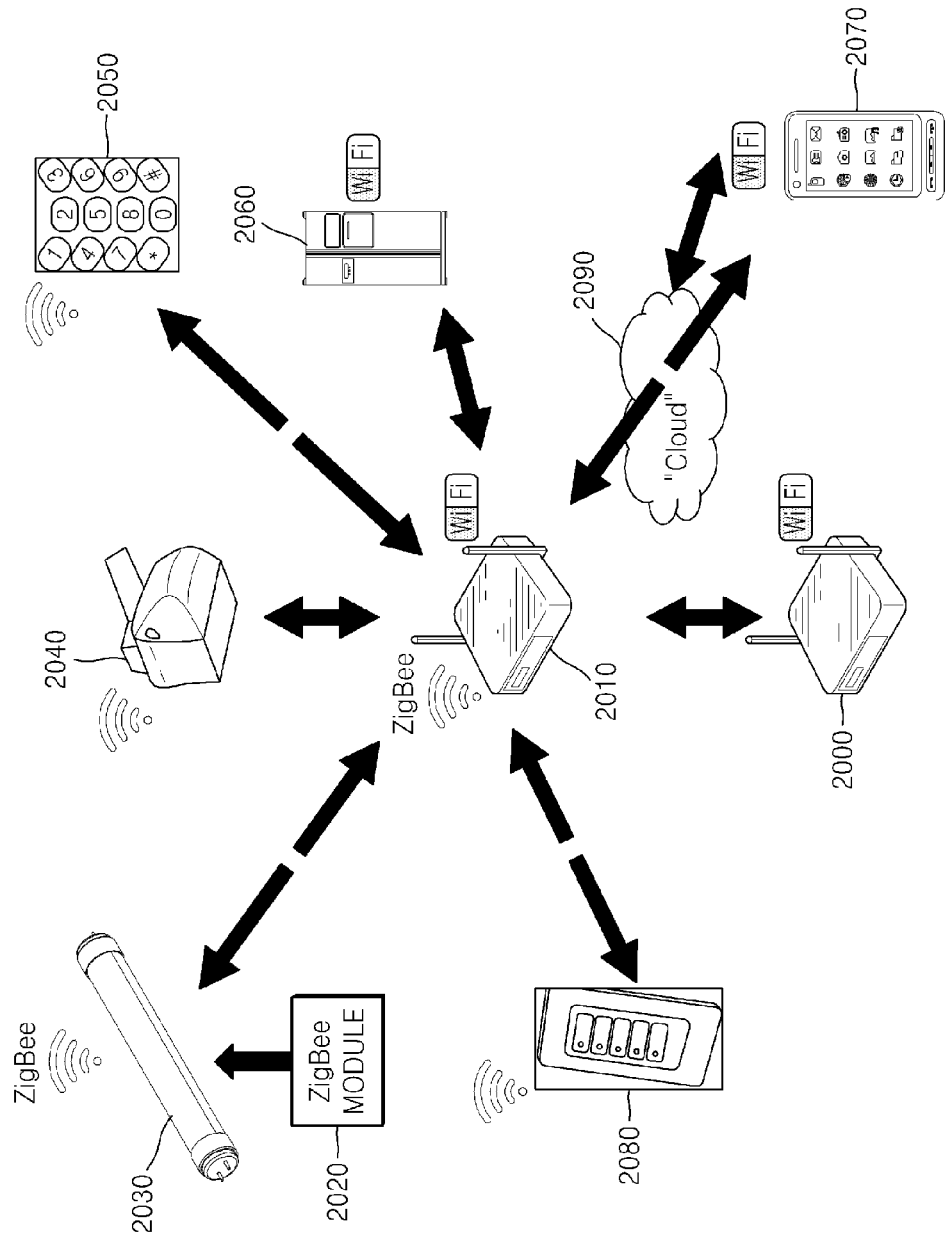
FIGS. 26 and 27 illustrate a home network to which a lighting system using the light source package is applied, according to an embodiment of the inventive concept.
Figure 27:
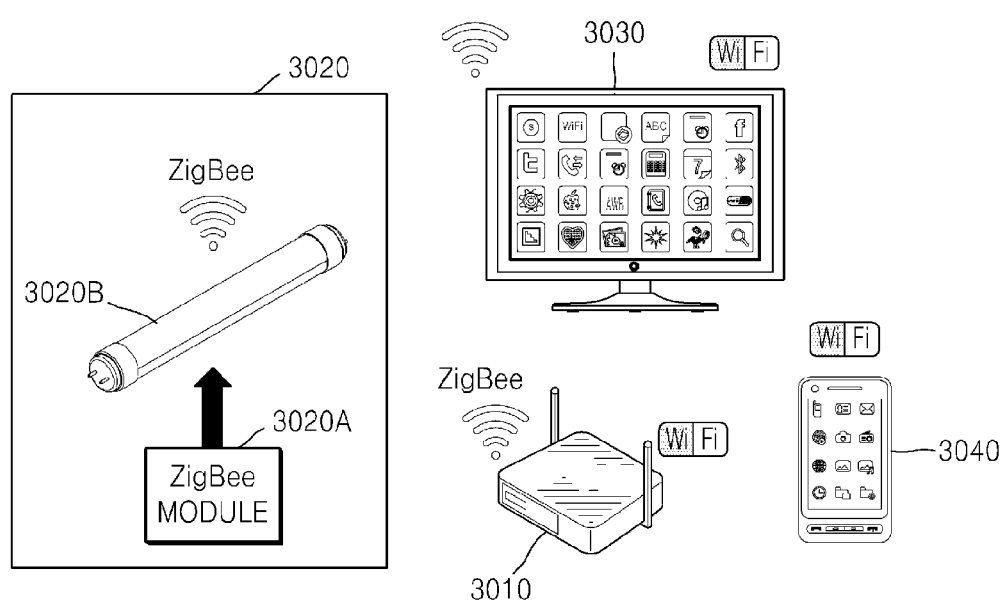

FIGS. 26 and 27 illustrate a home network to which a lighting system using a photo sensor integrated-type light-emitting apparatus is applied, according to an embodiment of the inventive concept.

As illustrated in FIG. 26, the home network may include a home wireless router 2000, a gateway hub 2010, a ZigBee module 2020, an LED lamp 2030, a garage door lock 2040, a wireless door lock 2050, home application 2060, a cell phone 2070, a wall-mounted switch 2080, and a cloud network 2090.

According to operating statuses of a bedroom, living room, entrance, garage, electric home appliances, or the like and ambient environments/situations, illumination brightness of the LED lamp 2030 may be automatically adjusted by using in-house wireless communication such as ZigBee, Wi-Fi, or the like.

For example, as illustrated in FIG. 27, according to type of program broadcasted on a TV 3030 or brightness of a screen of an LED lamp 3020B, illumination brightness of a tubular-type light-emitting apparatus 3020B may be automatically adjusted by using a gateway 3010 and a ZigBee module 3020A. When a cozy atmosphere is required due to broadcasting of a soap opera, illumination may be adjusted to have a color temperature equal to or less than 12,000K according to the cozy atmosphere. Alternatively, when a light atmosphere is required due to broadcasting of a comedy program, illumination may be adjusted to have a color temperature equal to or greater than 12,000K and may have a blue-based white color.

The ZigBee module 2020 or 3020A may be integrally modularized with a photo sensor, and may be integrally formed with a light-emitting apparatus.

Visible-light wireless communication technology involves wirelessly delivering information by using light having a visible wavelength band that is visible to human eyes. The visible-light wireless communication technology is different from a conventional wired optical communication technology and conventional infrared wireless communication in that the visible-light wireless communication technology uses light having a visible wavelength band, and is different from the conventional wired optical communication technology in that the visible-light wireless communication technology uses a wireless environment. Also, the visible-light wireless communication technology has excellent convenience and physical security in that the visible-light wireless communication technology is not regulated or controlled in terms of a frequency usage, unlike conventional radio frequency (RF) wireless communication. This is unique since a user may check a communication link, and most of all, the visible-light wireless communication technology has a characteristic of a convergence technology by simultaneously allowing for an light source to be used for its original purpose and an additional purpose of a communication function.

Also, the LED illumination may be used as inner or outer light sources for vehicles. For the inner light sources, the LED illumination may be used as an inner light, a reading light, a gauge board, or the like for vehicles, and for the outer light sources, the LED illumination may be used as a headlight, a brake light, a direction guide light, a fog light, a daytime running light, or the like for vehicles.

An LED using a particular wavelength may promote a growth of plants, may stabilize human feelings, or may help treatment for a disease. The LED may be applied to a light source that is used in robots or various mechanical equipment. In addition to a LED having low power consumption and a long lifetime, it is possible to embody illumination of the present invention in combination with a nature-friendly renewable energy power system such as a solar cell system, a wind power system, or the like.

While the inventive concept has been particularly shown and described with reference to exemplary embodiments thereof, it will be understood that various changes in form and details may be made therein without departing from the spirit and scope of the following claims.

What is claimed is:

1. A light source package comprising:
a substrate;
a light-emitting device mounted on the substrate;
a red phosphor layer formed adjacent to a surface of the light-emitting device; and
an encapsulation layer for encapsulating the light-emitting device and the red phosphor layer,
wherein a phosphor of the red phosphor layer is a fluoride-based red phosphor or a sulfide-based red phosphor,
wherein the light-emitting device is a blue light-emitting device, and a wavelength of a peak of blue light that is emitted from the light-emitting device is between about 442 nm and about 457 nm, and after peak normalization is performed, full width at half maximum of the wavelength is between about 15 nm and about 25 nm.

2. The light source package of claim 1, wherein the red phosphor layer further comprises a green phosphor.

3. The light source package of claim 1, wherein the red phosphor layer is coated on a top surface and a side surface of the light-emitting device.

4. The light source package of claim 3, wherein the red phosphor layer is coated in a hemisphere form on the top surface and the side surface of the light-emitting device.

5. The light source package of claim 3, wherein the red phosphor layer is conformally coated on the top surface and the side surface of the light-emitting device.

6. The light source package of claim 1, wherein the red phosphor layer is coated only on a top surface of the light-emitting device.

7. The light source package of claim 6, further comprising: a blocking layer that is disposed above the red phosphor layer, wherein the encapsulation layer surrounds the blocking layer.

8. The light source package of claim 7, further comprising:

a reflector that is disposed in a side direction of the light-emitting device, wherein the blocking layer extends onto a side wall surface of the reflector.

9. The light source package of claim 1, wherein the red phosphor layer is disposed between the light-emitting device and the substrate.

10. The light source package of claim 1, wherein a green light-emitting device that is adjacent to the light-emitting device is further mounted on the substrate.

11. The light source package of claim 1, wherein a nitride-based red phosphor or a silicate-based red phosphor is not included in the encapsulation layer.

12. The light source package of claim 1, wherein the red phosphor layer comprises a matrix and red phosphors that are substantially and uniformly distributed in the matrix, and wherein the matrix is formed of a same material as that of the encapsulation layer.

13. A display device that comprises a light source package and a color filter layer that receives light emitted from the light source package,
wherein the light source package comprises:
a substrate;
a light-emitting device mounted on the substrate;
a red phosphor layer formed adjacent to a surface of the light-emitting device; and
an encapsulation layer for encapsulating the light-emitting device and the red phosphor layer,
wherein a phosphor of the red phosphor layer is a fluoride-based red phosphor or a sulfide-based red phosphor.

14. The display device of claim 13, wherein the color filter layer is configured so that color coordinates of light that has passed the color filter layer belong to a space surrounded by blue (0.143, 0.043), (0.136, 0.091), (0.155, 0.075), (0.159, 0.0168), green (0.119, 0.659), (0.114, 0.824), (0.176, 0.778), (0.275, 0.691), and red (0.631, 0.314), (0.619, 0.341), (0.647, 0.349), (0.732, 0.261) color coordinates according to the CIE 1931.

15. A light source package comprising:
a substrate;
a light-emitting device on the substrate;
a fluoride-based or sulfide-based red phosphor layer through which light emitted by the light-emitting device passes; and
an insulating layer insulating the light-emitting device and the red phosphor layer from a package exterior,
wherein the light-emitting device is a blue light-emitting device, and a wavelength of a peak of blue light that is emitted from the light-emitting device is between about 442 nm and about 457 nm, and after peak normalization is performed, full width at half maximum of the wavelength is between about 15 nm and about 25 nm.

16. The light source package of claim 15,
wherein the insulating layer comprises an encapsulation layer which encapsulates the red phosphor layer and light-emitting device; and
wherein the insulating layer includes a blocking layer embedded within the encapsulation layer above the red phosphor layer.

17. The light source package of claim 15, wherein the red phosphor layer is coated on a top surface and a side surface of the light-emitting device.

18. The light source package of claim 15, wherein the red phosphor layer is coated in a hemisphere form on the top surface and the side surface of the light-emitting device.

19. The light source package of claim 15, wherein the red phosphor layer is coated only on a top surface of the light-emitting device.

* * * * *